United States Patent
Books et al.

(10) Patent No.: US 11,892,482 B2
(45) Date of Patent: Feb. 6, 2024

(54) SYSTEM AND METHOD FOR IMPROVING A BATTERY MANAGEMENT SYSTEM

(71) Applicant: Cummins Inc., Columbus, IN (US)

(72) Inventors: Martin T. Books, Columbus, IN (US); Craig M. Calmer, Columbus, IN (US); Robert Dziuba, Columbus, IN (US); Mahesh Madurai-Kumar, Columbus, IN (US); Praveen Chitradurga Muralidhar, Indianapolis, IN (US); John P. O'Brien, Columbus, IN (US); Joseph E. Paquette, Columbus, IN (US); Gary L. Parker, Columbus, IN (US); Anthony K. Perfetto, Columbus, IN (US); Jeffrey S. Rauch, Columbus, IN (US); Zachary Schwab, Columbus, IN (US); Jon S. Wardlow, Columbus, IN (US)

(73) Assignee: Cummins Inc., Columbus, IN (US)

( * ) Notice: Subject to any disclaimer, the term of this patent is extended or adjusted under 35 U.S.C. 154(b) by 0 days.

(21) Appl. No.: 17/951,720

(22) Filed: Sep. 23, 2022

(65) Prior Publication Data
US 2023/0018314 A1 Jan. 19, 2023

Related U.S. Application Data

(63) Continuation of application No. 16/528,985, filed on Aug. 1, 2019, now Pat. No. 11,493,541, which is a
(Continued)

(51) Int. Cl.
*G01R 19/00* (2006.01)
*B60R 16/03* (2006.01)

(52) U.S. Cl.
CPC .......... *G01R 19/0092* (2013.01); *B60R 16/03* (2013.01)

(58) Field of Classification Search
None
See application file for complete search history.

(56) References Cited

U.S. PATENT DOCUMENTS

| | | |
|---|---|---|
| 4,489,242 A | 12/1984 | Worst |
| 5,291,960 A | 3/1994 | Brandenburg et al. |
| (Continued) | | |

FOREIGN PATENT DOCUMENTS

| | | |
|---|---|---|
| CN | 102069795 | 11/2013 |
| EP | 0 537 873 A1 | 4/1993 |
| (Continued) | | |

OTHER PUBLICATIONS

International Search Report and Written Opinion for International Application No. PCT/US2015/046552, dated Nov. 27, 2015, 7 pages.

*Primary Examiner* — Todd Melton
*Assistant Examiner* — Jason R Roberson
(74) *Attorney, Agent, or Firm* — Foley & Lardner LLP

(57) ABSTRACT

A method includes determining, by a controller, a presence of an available electrical energy quantity generated from an energy generation event; comparing, by the controller, the available electrical energy quantity to an available energy capacity of a battery storage system; and responsive to determining the available electrical energy quantity exceeds the available energy capacity of the battery storage system, causing, by the controller, a transmission of at least a portion of the available energy quantity to a heat management system.

20 Claims, 9 Drawing Sheets

Related U.S. Application Data continuation of application No. 14/806,463, filed on Jul. 22, 2015, now Pat. No. 10,379,143.

(60) Provisional application No. 62/052,593, filed on Sep. 19, 2014, provisional application No. 62/027,934, filed on Jul. 23, 2014.

(56) References Cited

U.S. PATENT DOCUMENTS

| | | | |
|---|---|---|---|
| 5,637,933 A | 6/1997 | Rawlings et al. | |
| 5,898,282 A | 4/1999 | Drozdz et al. | |
| 6,036,449 A | 3/2000 | Nishar et al. | |
| 6,465,908 B1 | 10/2002 | Karuppana et al. | |
| 6,474,950 B1 | 11/2002 | Waldo | |
| 6,598,496 B2 | 7/2003 | Pannell | |
| 6,700,386 B2 | 3/2004 | Egami | |
| 6,863,139 B2 | 3/2005 | Egami et al. | |
| 6,982,540 B2 | 1/2006 | Richter et al. | |
| 7,026,724 B1 | 4/2006 | Blackburn | |
| 7,028,793 B2 | 4/2006 | Hu et al. | |
| 7,059,279 B2 | 6/2006 | Bystedt et al. | |
| 7,076,350 B2 | 7/2006 | Lvarez-Troncoso et al. | |
| 7,098,555 B2 | 8/2006 | Glahn et al. | |
| 7,119,454 B1 | 10/2006 | Chiao | |
| 7,360,615 B2 | 4/2008 | Salman et al. | |
| 7,694,250 B2 | 4/2010 | Boutin | |
| 7,753,147 B2 | 7/2010 | Usoro | |
| 7,805,229 B1 | 9/2010 | Blackwell et al. | |
| 8,035,349 B2 | 10/2011 | Lubawy | |
| 8,097,974 B2 | 1/2012 | Esaka et al. | |
| 8,116,955 B2 | 2/2012 | Huseman | |
| 8,148,924 B2 | 4/2012 | Ohkuwa et al. | |
| 8,186,466 B2 | 5/2012 | Verbrugge et al. | |
| 8,260,494 B2 | 9/2012 | Yang et al. | |
| 8,444,527 B2 | 5/2013 | Usoro | |
| 8,467,950 B1 | 6/2013 | Pfefferl et al. | |
| 8,489,266 B2 | 7/2013 | Ueda et al. | |
| 8,547,055 B2 | 10/2013 | Mack | |
| 8,548,660 B2 | 10/2013 | Alte | |
| 8,991,536 B2 | 3/2015 | Dieckmann et al. | |
| 9,688,260 B2 | 6/2017 | Aixala et al. | |
| 10,041,552 B2 | 8/2018 | Ulrey et al. | |
| 10,060,427 B2 | 8/2018 | Siuchta et al. | |
| 2002/0171392 A1 | 11/2002 | Richter et al. | |
| 2004/0253489 A1 | 12/2004 | Horgan et al. | |
| 2006/0046895 A1 | 3/2006 | Thacher et al. | |
| 2006/0127224 A1 | 6/2006 | Sweet et al. | |
| 2007/0209849 A1 | 9/2007 | Usoro | |
| 2007/0280833 A1 | 12/2007 | Miyake et al. | |
| 2008/0292471 A1 | 11/2008 | Sweet et al. | |
| 2010/0019718 A1* | 1/2010 | Salasoo | B60L 58/15 320/128 |
| 2010/0082198 A1 | 4/2010 | Arai et al. | |
| 2010/0151989 A1* | 6/2010 | Read | B60T 1/10 477/4 |
| 2010/0179714 A1 | 7/2010 | Tani et al. | |
| 2010/0296949 A1 | 11/2010 | Corley | |
| 2011/0125351 A1 | 5/2011 | Bauerle | |
| 2011/0231047 A1 | 9/2011 | Aixala et al. | |
| 2011/0259189 A1 | 10/2011 | Diekmeyer et al. | |
| 2011/0260660 A1* | 10/2011 | Lubawy | H02J 7/0048 318/376 |
| 2012/0107138 A1 | 5/2012 | Kreso et al. | |
| 2012/0186241 A1 | 7/2012 | De Miranda et al. | |
| 2012/0316713 A1 | 12/2012 | Pfefferl et al. | |
| 2013/0000295 A1 | 1/2013 | Bissontz | |
| 2013/0001006 A1 | 1/2013 | Gibson et al. | |
| 2013/0204490 A1 | 8/2013 | Pfefferl et al. | |
| 2013/0231808 A1 | 9/2013 | Flath et al. | |
| 2013/0333969 A1 | 12/2013 | Dieckmann et al. | |
| 2014/0001847 A1 | 1/2014 | Khandelwal | |
| 2014/0012450 A1 | 1/2014 | Laing | |
| 2014/0034009 A1 | 2/2014 | Brinkmann et al. | |
| 2014/0049381 A1 | 2/2014 | Moon et al. | |
| 2014/0136075 A1* | 5/2014 | Gonze | F01P 7/167 701/102 |
| 2014/0200755 A1 | 7/2014 | Sisk et al. | |
| 2014/0200756 A1 | 7/2014 | Sisk | |
| 2014/0200763 A1 | 7/2014 | Sisk | |
| 2014/0236467 A1 | 8/2014 | Liu et al. | |
| 2014/0369853 A1 | 12/2014 | Siuchta et al. | |
| 2015/0094926 A1* | 4/2015 | O'Meachair | B60W 30/18127 701/70 |
| 2015/0219083 A1 | 8/2015 | Huffman et al. | |
| 2015/0367834 A1 | 12/2015 | Runde et al. | |
| 2016/0075324 A1 | 3/2016 | Brombach et al. | |
| 2016/0153385 A1 | 6/2016 | Pursifull | |
| 2016/0184763 A1 | 6/2016 | Wimmer et al. | |
| 2016/0264126 A1 | 9/2016 | Ketfi-Cherif et al. | |
| 2017/0001481 A1 | 1/2017 | Kraayenbrink et al. | |
| 2017/0015176 A1 | 1/2017 | Ulrey et al. | |
| 2017/0282889 A1 | 10/2017 | Books et al. | |
| 2017/0305372 A1 | 10/2017 | Adler et al. | |
| 2017/0355371 A1 | 12/2017 | Higgins | |

FOREIGN PATENT DOCUMENTS

| | | |
|---|---|---|
| EP | 2 514 620 A1 | 10/2012 |
| JP | 2004-194495 | 7/2004 |
| KR | 2009062867 | 6/2009 |
| WO | WO-2012/106787 A1 | 8/2012 |
| WO | WO-2012/128770 A1 | 9/2012 |
| WO | WO-2014/109887 A2 | 7/2014 |

* cited by examiner

SYSTEM AND METHOD FOR IMPROVING A BATTERY MANAGEMENT SYSTEM

CROSS-REFERENCE TO RELATED PATENT APPLICATIONS

This application is a continuation of U.S. patent application Ser. No. 16/528,985, filed Aug. 1, 2019, which is a continuation of U.S. patent application Ser. No. 14/806,463, filed Jul. 22, 2015, which claims the benefit of and priority to (a) U.S. Provisional Patent Application No. 62/027,934, filed Jul. 23, 2014, and (b) U.S. Provisional Patent Application No. 62/052,593, filed Sep. 19, 2014, all of which are incorporated herein by reference in their entireties.

TECHNICAL FIELD

The present disclosure relates to heat management systems and battery management systems. More particularly, the present disclosure relates to electric heat management systems and improved battery management systems.

BACKGROUND

Accumulator systems are used in a variety of applications. From vehicles to industrial applications, accumulator systems are used to compress a medium, store the compressed (now pressurized) medium, and provide the pressurized medium. The pressurized medium may power one or more components. For example, air may be compressed and stored. The compressed air may be used to power a pneumatic tool (e.g., an air-powered nail gun). In regard to a vehicle, the accumulator system may be used to power the air brakes (in which case, the medium is air), power an air condition system (medium may be a refrigerant), or provide power to any other type of pressurized-fluid actuated component in the vehicle. The compressor for such system is usually driven by the engine. Accordingly, when the engine is on, the compressor is running. As such, the compressor speed is tied to the engine speed. Because the accumulator tanks may be full and/or the speed of the compressor may be sub-optimal due to being linked to the engine speed, operation of the accumulator system may lead to a loss in energy in the vehicle. This may cost vehicle operators money over the course of operation of the vehicle.

Analogously, radiator systems are used in vehicles to manage the heat of the engine and, in particular, to cool the engine to safe and efficient operating temperatures. The radiator system includes a fluid circuit configured to transfer coolant from the radiator to the engine and back to the radiator system. Cooling fans are used with the radiator system to cool the radiator and thereby reduce the temperature of the coolant contained in the radiator. A conventionally employed cooling strategy operates the cooling fan independent of the storage level of the battery system. Accordingly, the extra load placed on the engine to operate the cooling fan generally increases the fuel consumption and/or efficiency of the engine.

SUMMARY

One embodiment relates to an apparatus. The apparatus includes an energy generation module operatively coupled to one or more energy generation sources, wherein the energy module is structured to receive energy data indicative of an availability of free energy. The apparatus also includes an accumulator module communicably coupled to the energy module, wherein the accumulator module is structured to receive pressure data indicative of a pressure in an accumulator tank of an accumulator system and facilitate charging the accumulator tank based on an indication of free energy relative to the pressure of the accumulator tank.

Another embodiment relates to a method. The method includes receiving, by a controller, pressure data for an accumulator system, the pressure data providing an indication of a pressure in an accumulator tank of the accumulator system; receiving, by the controller, energy data, the energy data indicating an availability of free energy for use to charge the accumulator tank; and activating, by the controller, a charging source of the accumulator tank to charge the accumulator tank based on at least one of the pressure data and the energy data.

Another embodiment relates to a system. The system includes an accumulator system having an accumulator tank and an electric compressor structured to charge the accumulator tank and a controller operatively and communicably coupled to the accumulator system. The controller is structured to: receive pressure data indicative of a pressure in the accumulator tank; receive energy data indicative of an availability of free energy to power the electric compressor to charge the accumulator tank; and activate the electric compressor to charge the accumulator tank based on at least one of the pressure data and the energy data.

Still another embodiment relates to a method. The method includes determining, by a controller, a presence of an available electrical energy quantity generated from an energy generation event; comparing, by the controller, the available electrical energy quantity to an available energy capacity of a battery storage system; and responsive to determining the available energy quantity exceeds the available energy capacity of the battery storage system, causing, by the controller, a transmission of at least a portion of the available energy quantity to a heat management system.

Yet another embodiment relates to a system. The system includes an engine; a heat management system coupled to the engine, the heat management system having a fan and coolant, wherein the coolant absorbs heat from the engine, and wherein the fan is actuated based on a target temperature of the coolant and a sensed temperature of the coolant; and a controller operatively and communicably coupled to the engine and the heat management system, the controller structured to selectively adjust the target temperature in response to a condition of at least one of a battery and the engine to manage energy consumption by the fan.

Another embodiment relates to an apparatus. The apparatus includes a heat management module structured to receive temperature data indicative of a temperature of coolant used in a heat management system operatively coupled to an engine. The apparatus also includes an energy generation module structured to determine a presence of an available electrical energy quantity generated from an energy generation event. The apparatus further includes a comparator module structured to compare the available electrical energy quantity to an available energy capacity of a battery storage system. According to one embodiment, in response to the comparison, the heat management module is structured to manage a target temperature of the coolant to control activation of a fan in the heat management system and manage energy consumption by the fan.

One embodiment relates to a method. The method includes monitoring, by a controller, an alternator current of a battery system of a vehicle; comparing, by the controller, the monitored alternator current to a current limit of the alternator; receiving, by the controller, energy data, energy storage data, and current data; determining, by the controller, if an energy output of the battery system should be reduced based on the alternator current, current limit, and the received energy data, energy storage data, and current data; for each engine subsystem of an engine of the vehicle, determining, by the controller, a criticality of a load from operation of the engine subsystem; for each engine subsystem, determining, by the controller, an energy storage capability and an energy generation capability of the engine subsystem; and determining, by the controller, a prioritization structure for the engine subsystems based on the criticality of the load and the energy storage capability and the energy generation capability of the engine subsystems.

Still another embodiment relates to a system. The system includes a power system including a battery system structured to store energy to be used to power one or more engine subsystems of an engine of a vehicle and an energy recovery system structured to harvest energy from one or more engine subsystems of the vehicle and to provide the energy to one or more engine subsystems. The system also includes a controller operatively and communicably coupled to the power system. According to one embodiment, the controller is structured to: monitor an alternator current of the battery system; compare the monitored alternator current to a current limit of the alternator; receive energy data, energy storage data, and current data; determine if an energy output of the battery system should be reduced based on the alternator current, current limit, and the received energy data, energy storage data, and current data; for each engine subsystem, determine a criticality of a load from operation of the engine subsystem; for each engine subsystem, determine an energy storage capability and an energy generation capability of the engine subsystem; and determine a prioritization structure for the engine subsystems based on the criticality of the load and the energy storage capability and the energy generation capability of the engine subsystems.

Yet another embodiment relates to an apparatus. The apparatus includes a battery module structured to manage energy to be used to power one or more engine subsystems of an engine of a vehicle. The apparatus also includes an energy module structured to harvest energy from one or more engine subsystems of the vehicle and to provide the energy to one or more engine subsystems. The apparatus further includes a comparator module communicably coupled to the battery module and the energy module. According to one embodiment, the comparator module is structured to: monitor the alternator current of the battery system; compare the monitored alternator current to a current limit of the alternator; receive energy data, energy storage data, and current data; and determine if an energy output of the battery system should be reduced based on the alternator current, current limit, and the received energy data, energy storage data, and current data. The apparatus still further includes a prioritization module structured to: for each engine subsystem, determine a criticality of a load from operation of the engine subsystem; for each engine subsystem, an energy storage capability and an energy generation capability of the engine subsystem; and determine a prioritization structure for the engine subsystems based on the criticality of the load and the energy storage capability and the energy generation capability of the engine subsystems.

Advantages and features of the embodiments of this disclosure will become more apparent from the following detailed description of exemplary embodiments when viewed in conjunction with the accompanying drawings.

DETAILED DESCRIPTION

Figure 1:
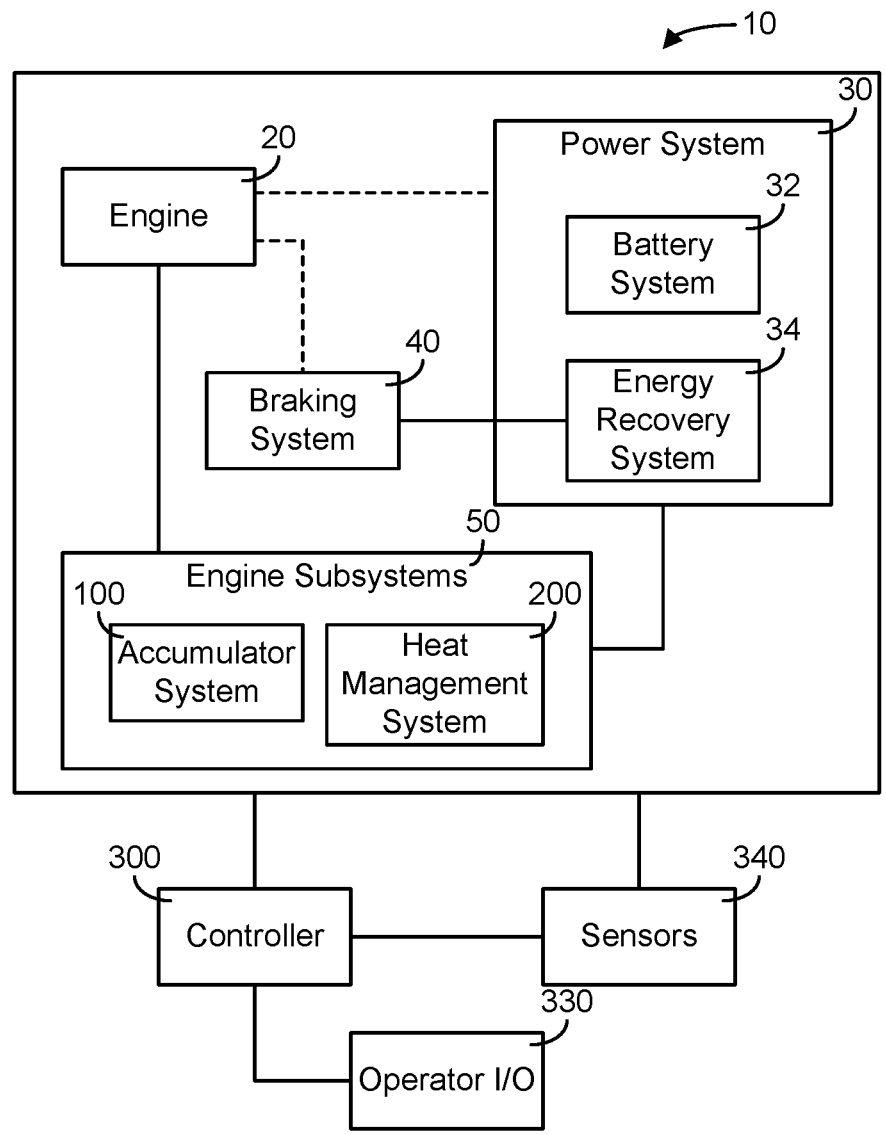
FIG. 1 is a schematic diagram of an engine system with a controller, according to an example embodiment.

Following below are more detailed descriptions of various concepts related to, and implementations of, methods, apparatuses, and systems for improving a battery management system and accumulator system. The various concepts introduced above and discussed in greater detail below may be implemented in any of numerous ways, as the described concepts are not limited to any particular manner of implementation. Examples of specific implementations and applications are provided primarily for illustrative purposes.

Referring to the figures generally, the various embodiments disclosed herein relate to a system, apparatus, and method for improving a battery management system and accumulator system. With the advent of new automotive technologies such as hybrid vehicles and the new presence of an ample electrical energy supply on vehicle, engine accessories that have traditionally been belt driven are becoming electrically driven. These accessories include such things as air compressors (for pneumatic devices), air conditioning, power steering pumps, engine coolant pumps, fans, etc. Standard economic analysis usually dictates that these electrical generating and drive devices be sized as small as possible to keep cost and weight down. Electrically driven accessories are generally sized such that they are able to perform their required task with enough margin to assure both performance at off-nominal conditions and a lifetime that meets warranty requirements. The electric power supply (generally an alternator or battery) is sized to meet the typical electrical loads expected over an operating cycle. The electric power supply sizing may be reduced if all or mostly all accessories are interpreted as being critical (such as an air conditioning compressor), and if the accessory loading exceeds the power supply capacity, then in an individualistic manner, some loads may be turned off.

If the power supply is undersized to meet 100% of the electrical accessory load 100% of the time, then a means must be provided to manage the imbalance. Traditional approaches manage the output voltage, such that if the voltage begins to drop due to excessive loading, then some of the loads must be turned off or disconnected. However, this is a reactive method that, while never turning accessories off prematurely, always assures that the accessories must be operated for some time with insufficient voltage in order to detect the condition. Furthermore, with this reactive approach, it is difficult to know when it is acceptable to turn the accessories back on.

Instead, the various embodiments of the present disclosure suggests a proactive approach that estimates, predicts, and/or determines loading of each individual assorted electrified accessory, combined with an estimate of the electrical capacity of the power supply. Then comparisons of the electrical power supply and collective power loads may be made to predict or determine whether the supply meets the demand. If this prediction ever indicates insufficient supply, then one or more accessories in an individualistic manner may be run at a reduced power consumption, up to the point of being turned off completely to remedy the situation. As soon as the predicted power supply is determined to meet or exceed the desired full accessory loading, then one or more of the accessories may be returned to their original power settings as the power balance allows. This has the advantage of being proactive, substantially never subjecting the electrical accessories to "brown-out" or under-voltage type conditions, and of providing a means of knowing when loads may be reapplied.

Advantageously, according to the present disclosure, the loads may be prioritized and/or categorized based on their individual properties. Individual loads may be adjusted down in an analog fashion substantially only if the total load exceeds the power supply. Loads may be adjusted in order of increasing priority, and may only be adjusted until the total load drops below the available power supply. Loads may not necessarily be shut off completely, unless shutting off is a normal operating mode of that device and is appropriate for current operating conditions. Conversely, loads may also be adjusted upward if a vehicle braking event indicates free energy is available. Each load has its own priority (all may be different) and a range of allowed adjustability. In one embodiment, the controller may communicate with the controllers for the individual primary loads (e.g. hydraulic pumps, radiator fan, pneumatic compressor, air conditioning compressor). As a result, the only loads that are managed are those loads that are directly controlled, such that the individual loads will be known as the devices perform their primary function (without requiring any kind of time series regression). The total loading is then tallied and compared to the available power supply. In the event of an indicated overload, individual devices can be derated, with the derates occurring in order of increasing priority until the overload is eliminated. This control strategy may provide a robust and individualistic control approach with the loads to facilitate better management and operating characteristics.

As used herein, the term "free energy" refers to energy (e.g., electricity) that is otherwise lost. Free energy may be recovered using an energy recovery system (e.g., from power system 30). In one example, the energy recovery system is structured as a regenerative braking system. In the regenerative braking configuration, as an operator of a vehicle applies the brake pedal, an electric motor reverses directions and generates electricity. This electricity may be stored in one or more batteries and used to power one or more components. Here, the electricity generated by the regenerative braking system is provided to an electric compressor (i.e., the electric motor powering the compressor) and/or a heat management system (i.e., a fan to cool a radiator). In comparison, non-free energy refers to energy expenditures for a specific purpose. For example, non-free energy would include utilizing a fuel to power an internal combustion engine to power an engine accessory. Here, although fuel may be used to power the internal combustion engine, the free energy (from the regenerative braking system) is generated as a by-product of operation of the internal combustion engine. This is energy that would otherwise be lost as, for example, heat.

Referring now to FIG. 1, a schematic diagram of an engine system 10 with a controller 300 is shown, according to an example embodiment. According to one embodiment, the engine system 10 is embodied within a vehicle. The vehicle may include an on-road or an off-road vehicle including, but not limited to, line-haul trucks, mid-range trucks (e.g., pick-up truck, etc.), sedans, coupes, tanks, airplanes, boats, and any other type of vehicle. In some embodiments, the engine system 10 may be implemented in stationary devices, such as a power generator. All such variations are intended to fall within the spirit and scope of the present disclosure. Further, while FIG. 1 depicts the engine system 10 as including an internal combustion engine 20, the engine system 10 may be powered by another type of power source. For example, the engine system 10 may be a hybrid system or an internal combustion engine powered system as shown. These and other features of the present disclosure are described more fully herein below.

By way of example, the engine system 10 may typically include a powertrain system. The powertrain system includes an engine 20. The powertrain system may include any type of components typically included in powertrain systems. For example, the powertrain system may also include, but is not limited to, a transmission, a drive shaft, a differential, and a final drive. As a brief overview, in a vehicle implementation, the engine 20 receives a chemical energy input (e.g., a fuel such as gasoline, diesel, natural gas, propane, etc.) and combusts the fuel to generate mechanical energy, in the form of a rotating crankshaft. The transmission receives the rotating crankshaft and manipulates the speed of the crankshaft (i.e., the engine revolutions-per-minute (RPM), etc.) to affect a desired drive shaft speed. The rotating drive shaft is received by the differential, which provides the rotational energy of the drive shaft to the final drive. The final drive then propels or moves the vehicle.

The engine 20 may be structured as any internal combustion engine (e.g., compression-ignition, spark-ignition, etc.), such that it may be powered by any fuel type (e.g., diesel, ethanol, gasoline, etc.). Similarly, the transmission may be structured as any type of transmission, such as a continuous variable transmission, a manual transmission, an automatic transmission, an automatic-manual transmission, a dual clutch transmission, etc. Accordingly, as transmissions vary from geared to continuous configurations (e.g., continuous variable transmissions, etc.), the transmission can include a variety of settings (gears, for a geared transmission) that affect different output speeds based on the engine speed. Like the engine 20 and the transmission, the drive shaft, differential, and final drive may be structured in any configuration dependent on the application (e.g., the final drive is structured as wheels in an automotive application and a propeller in an airplane or boat application, etc.). Further, the drive shaft may be structured as any type of drive shaft including, but not limited to, a one-piece, a two-piece, and a slip-in-tube driveshaft based on the application.

As shown in FIG. 1, the engine system 10 includes a power system 30, a braking system 40, and engine subsystems 50. The power system 30 may include a battery system 32 and an energy recovery system 34. The battery system 32 may include one or more batteries. The battery system 32 is configured to store energy to be used to power one or more components of the engine subsystems 50. The energy recovery system 34 is structured to generate energy that would otherwise be lost during operation of the engine system 10 (e.g., in the form of friction, heat, etc.). In one embodiment, the energy generated by the energy recovery system 34 is stored in the battery system 32. In other embodiments, the energy recovery system 34 provides the generated energy directly to one or more components of the engine subsystems 50, bypassing the battery system 32. In still other embodiments, the energy recovery system 34 provides the generated energy to at least one of the battery system 32 and the engine subsystems 50. According to an example embodiment, the energy recovery system 34 is structured as an regenerative braking system. As shown in FIG. 1, the braking system 40 is coupled to the energy recovery system 34. The energy recovery system 34 is structured to harvest energy from the braking system 40 during braking events and produce electrical energy therefrom. Thus, the power system 30 is structured to harvest energy from the engine 20 that would otherwise be lost during operation of the engine system 10.

The engine subsystems 50 may be directly or indirectly coupled to the engine 20. For example, some of the engine subsystems 50 may be fluidly coupled to the engine 20 (e.g., an exhaust aftertreatment system, a heat management system, etc.), while other engine subsystems 50 may be indirectly powered from energy initially provided by the engine 20 (e.g., electric subsystems that are powered by the power system 30, etc.). The engine subsystems 50 may include both electrically-powered accessories and engine driven accessories, as well any other type of subsystem in the engine system 10. For example, the engine subsystems 50 may include an exhaust aftertreatment system. The exhaust aftertreatment system may include any component used to reduce exhaust emissions (e.g., diesel exhaust emissions, gas exhaust emissions, etc.), such as a selective catalytic reduction catalyst, a diesel oxidation catalyst, a diesel particulate filter, a diesel exhaust fluid doser with a supply of diesel exhaust fluid, and a plurality of sensors for monitoring the aftertreatment system (e.g., a NOx sensor, etc.). Furthermore, various accessories may include, but are not limited to, air compressors (for pneumatic devices), air conditioning systems, power steering pumps, engine coolant systems and pumps, fans, and the like.

According to the example embodiment shown in FIG. 1, the engine subsystems 50 include an accumulator system 100 and a heat management system 200. In other embodiments, the engine subsystems 50 may include different or additional subsystems, such as HVAC systems and power steering pumps. Therefore, the accumulator system 100 and the heat management system 200 are non-limiting examples of possible engine subsystems 50. The accumulator system 100 may include an electric air compressor that provides compressed air to an air tank, which is used to power one or more pneumatic devices of the engine system 10 (e.g., air brakes, power steering, etc.).

Referring still to FIG. 1, the engine system 10 may include one or more sensors 340 communicably coupled to one or more components of the engine system 10, the controller 300, and an operator input/output (I/O) device 330. Communication between and among the components of the engine system 10 may be via any number of wired or wireless connections. For example, a wired connection may include a serial cable, a fiber optic cable, a CATS cable, or any other form of wired connection. In comparison, a wireless connection may include the Internet, Wi-Fi, cellular, radio, etc. In one embodiment, a controller area network (CAN) bus provides the exchange of signals, information, and/or data. The CAN bus includes any number of wired and wireless connections. Because the controller 300 is communicably coupled to the systems and components in the engine system 10 of FIG. 1, the controller 300 may receive data from one or more of the components shown in FIG. 1. For example, the data may include pressure data, temperature data, energy data, energy storage data, and/or current data acquired via one or more of the sensors 340. As another example, the data may include an input from operator I/O device 330. As described more fully herein, with this data, the controller 300 may prioritize which of the engine subsystems 50, if any, receive energy from at least one of the battery system 32 and the energy recovery system 34 of the power system 30.

The operator I/O device 330 enables an operator of the engine system 10 to communicate with the engine system 10 and the controller 300. For example, the operator I/O device 330 may include, but is not limited to, an interactive display, a touchscreen device, one or more buttons and switches, voice command receivers, etc. The operator of the engine system 10 may also use the operator I/O device 330 to define various limits and a threshold for the operation of the engine 20, the power system 30, and/or the engine subsystems 50, which are described more fully herein.

As the components of FIG. 1 are shown to be embodied in the engine system 10, in one embodiment the controller 300 may be embodied as an add-on to an electronic control module (ECM). In some embodiments, the controller 300 may be a stand-alone tool that performs all required data logging, data tracking, data analysis, etc. needed to monitor the operation of the engine system 10. In some embodiments, the controller 300 is included in the ECM of a vehicle. The ECM may include a transmission control unit and any other vehicle control unit (e.g., exhaust aftertreatment control unit, powertrain control module, engine control module, etc.). In an alternative embodiment, the controller 300 is web based, server based, and/or application based (e.g., a smartphone app, a controller on the internet, etc.). The structure and function of the controller 300 is further described in regard to FIG. 4.

Figure 2:
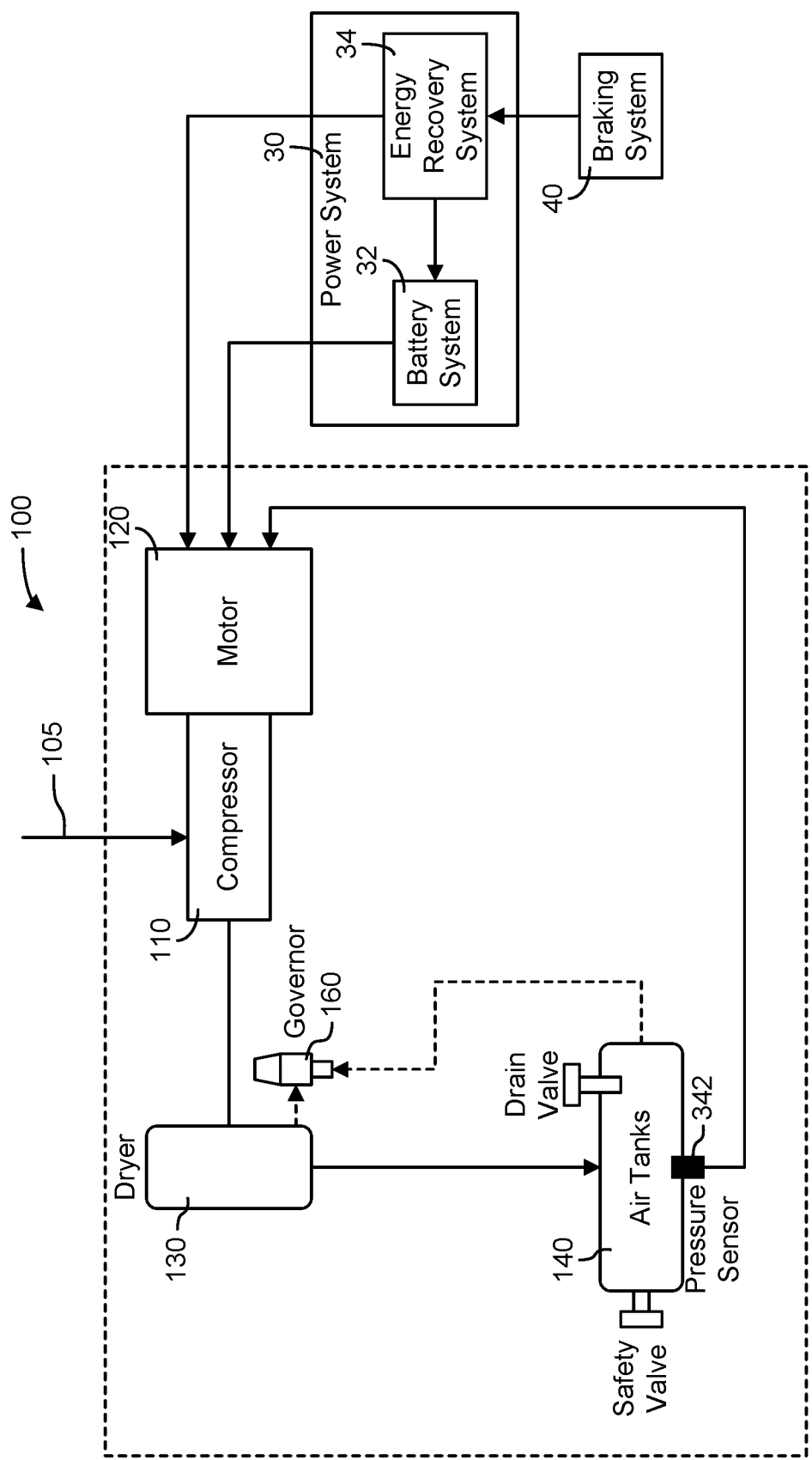
FIG. 2 is a schematic diagram of an accumulator system, according to an example embodiment.

Referring now to FIG. 2, the function and structure of the accumulator system 100 are shown according to one embodiment. As shown in FIG. 2, the accumulator system 100 includes a compressor 110, a motor 120, a dryer 130, an accumulator tank 140, a pressure sensor 342, and a governor 160. The compressor 110 receives a medium 105 (e.g., air, refrigerant, etc.). The motor 120 powers the compressor 110 to compress the medium 105. Collectively, the motor 120 and compressor 110 form an electric compressor. The compressed medium is then provided to a dryer 130. The dryer 130 is structured to substantially remove the moisture from the compressed medium. The accumulator system 100 may include more than one dryer 130 and the dryers may be of different types. As such, the dryer 130 may include, but is not limited to, a refrigerated dryer, a deliquescent dryer, a membrane dryer, etc. After drying, the medium 105 is provided to the accumulator tank 140. The accumulator tank 140 stores the dried, compressed medium 105 and may provide it as needed. For example, the accumulator tank 140 may provide the pressurized medium 105 to operate a pump (e.g., a wheel chair lift in a vehicle, an air brake system, etc.). One or more pressure sensors 342 measure the pressure in the accumulator tank 140 and provide this pressure data to the controller 300. The governor 160 is structured to purge the dryer 130 and/or the accumulator tank 140. In this regard, the governor 160 may function as a backup pressure relief actuator to the pressure sensor 342.

As mentioned above, the governor 160 enables a pressure release in the dryer 130 and/or the accumulator tank 140. Accordingly, the governor 160 may have various pressure settings, which trigger the opening of a valve such that the high pressure contents in the dryer 130 and/or the accumulator tank 140 may be released and the pressure lowered in the dryer 130 and/or the accumulator tank 140. The governor 160 may be structured as a mechanical governor, release valve, check valve, and the like. In some embodiments, the governor 160 may be structured as a solenoid valve. In one embodiment, the controller 300 may activate the governor 160 based on the pressure data. Alternatively, the pressure data signal may be provided directly to the governor 160 to enable automatic activation. In either configuration—mechanical governor or solenoid governor—the governor 160 functions to purge the dryer 130 and/or the accumulator tank 140. This may occur when the pressure reaches a certain level (e.g., cut-out pressure) and the compressor 110 is turned off.

The compressor 110 is structure-dependent on the application. Accordingly, the compressor 110 may be embodied as a reciprocating compressor, a rotary screw compressor, a rotary centrifugal compressor, variations thereof, and any other type of compressor based on the application. Similarly, the size (pressure output, medium flow output, horsepower) of the compressor 110 is dependent on the application. For example, a truck may utilize a compressor with a maximum pressure output of 150 pounds-per-square-inch ("PSI"), whereas a compressor in a building may require a substantially greater pressure output.

The compressor 110 is powered by the motor 120 rather than the engine 20. Thus, the compressor 110 speed is not tied to the engine speed. This allows the compressor 110 to operate independent of the engine 20, which enables optimum performance (e.g., energy savings from not constantly operating the compressor 110 and a greater efficiency by running the compressor 110 at the necessary speed rather than the speed of the engine 20, etc.). Because the compressor 110 is not related to the engine 20, the compressor 110 may be powered on/off by the controller 300 via activation/deactivation of the motor 120 despite continuous operation of the engine 20. This enables a relatively greater amount of energy savings and efficiency.

The motor 120 receives power from the power system 30. In one embodiment, the battery system 32 provides energy to the motor 120 to power the compressor 110. In other embodiments, when the vehicle is slowed down by the braking system 40, the motor 120 may receive free energy captured by the energy recovery system 34 of the power system 30. For example, an operator of the vehicle may apply the brakes, which causes the generation of electricity by the energy recovery system 34. Among other destinations, this electricity may be directly provided to the motor 120 to power the compressor 110 (and other components) and/or stored in the battery system 32. Although described as separate components (the motor 120 and the energy recovery system 34), the motor 120 may perform both functions (i.e., a unitary component). Hence, the motor 120 may operating in a "motoring" mode where power is provided to, e.g., the compressor 110, and a "generating" mode, where electricity is generated from a reversed direction (relative to the "motoring" rotation direction) of operation of the motor 120.

As with the compressor 110, the accumulator tank 140 may be structured (e.g., size, such as five gallons, etc.) based on the application of the system. Similarly, more than one accumulator tank 140 with corresponding pressure sensors 342 may be utilized. The pressure sensor 342 obtains pressure data regarding the accumulator tank 140. More than one pressure sensor 342 may be used per tank 140 and the pressure sensor 342 may take a wide variety of forms, such as a differential pressure sensor, a sealed pressure sensor, a vacuum pressure sensor, a gauge pressure, etc. The pressure data corresponds with the pressure in the accumulator tank(s) 140. This pressure corresponds with a current capacity of the tank(s) 140 (i.e., less pressure equates to a relatively less full tank 140). The pressure data is provided to the controller 300.

As a brief overview, the controller 300 receives data regarding the pressure in the accumulator tank 140 and data regarding operation of the engine system 10. The engine operation data provides an indication of when regenerative braking is occurring. The controller 300 utilizes the free energy from regenerative braking to power the compressor 110 and fill the accumulator tank 140. Because the energy from regenerative braking is not always available, the controller 300 may include an adjustable tank pressure setting. The adjustable tank pressure setting may function like a cut-out setting for the compressor 110. If the pressure in the accumulator tank drops below a predetermined minimum, the controller 300 will activate the compressor 110. Because no free energy is available, the compressor 110 is driven by non-free energy (e.g., from the battery system 32). Rather than continuing to use this non-free energy to fill the accumulator tank 140 to the cut-out pressure, the adjustable tank pressure setting acts as a trigger to the controller 300 to shut the compressor 110 down. Thus, the pressure setting is below the cut-out setting. Although the accumulator tank 140 may not be full, the pressure in the accumulator tank 140 is above the minimum level and energy was conserved by not running the compressor 110 until the cut-out pressure in the accumulator tank 140 was reached. Accordingly, in some embodiments, the example accumulator systems of the present disclosure provide a method of minimizing the amount of non-free energy used in an accumulator system.

Because the accumulator tank 140 can vary based on the application, so can the cut-in pressure and the cut-out pressure. The cut-in pressure refers to the minimum pressure allowed in the accumulator tank 140. When the pressure in the accumulator tank 140 is at or below the cut-in pressure, the controller 300 activates the compressor 110 (i.e., motor 120) to refill the accumulator tank 140. The cut-out pressure refers to the maximum pressure allowed in the accumulator tank 140. At the cut-out pressure, the controller 300 deactivates the compressor 110 to prevent over-pressurizing the accumulator tank 140. Both the cut-in and cut-out pressure may be preset using the controller 300 and may vary based on the application.

Figure 3:
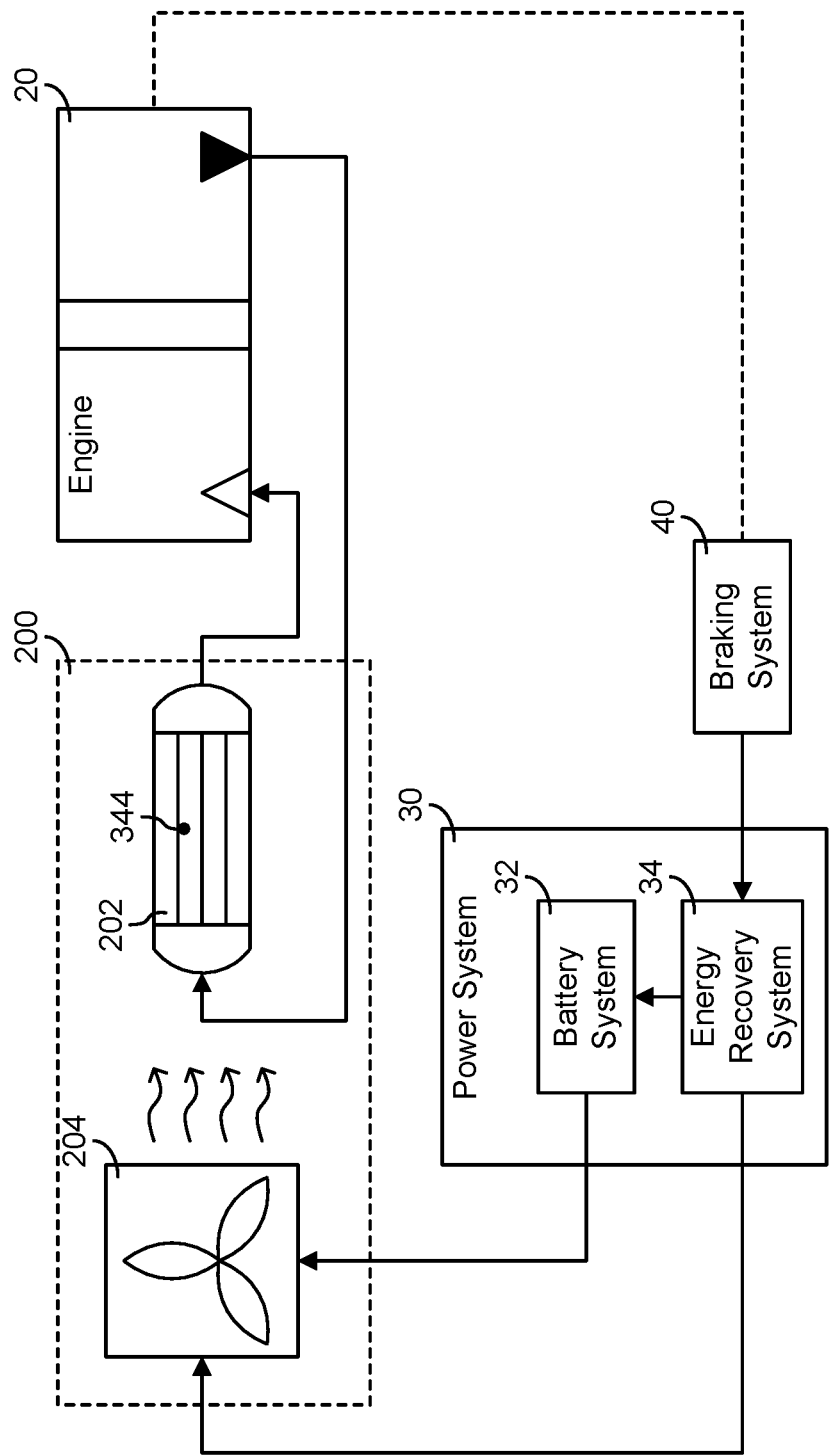
FIG. 3 is schematic diagram of a heat management system, according to an example embodiment.

Referring now to FIG. 3, the function and structure of the heat management system 200 are shown according to one embodiment. The heat management system 200 for the engine 20 includes a radiator 202 and a cooling fan 204. The cooling fan 204 may include an electrical cooling fan or a fan mechanically connected to an engine, but electrically operated or controlled, for example via an electrically operated clutch. The radiator 202 is fluidly coupled to the engine 20 to pass coolant from the radiator 202 to the engine 20 and back to the radiator 202. The coolant absorbs heat from the engine 20 as the coolant passes through the engine 20. Flow of the coolant from the radiator 202 to the internal combustion engine 20 may be controlled via one or more thermostats configured to open once the temperature of the engine 20 reaches a certain temperature. The heated coolant returns to the radiator 202 from the engine 20, to be cooled in the radiator 202.

According to an example embodiment, the cooling fan 204 blows air across the radiator 202 to increase the cooling of the radiator 202 as warranted. The timing (period of actuation) and speed of the cooling fan 204 are controlled in response to the temperature of the coolant and hence required cooling of the coolant. The required cooling of the coolant may be sensed by one or more temperature sensors 344, such as a thermocouple, positioned in the radiator 202 or along the fluid circuit from the engine 20 to the radiator 202. More specifically, the controller 300 is configured to control the operation of the cooling fan 204 based on sensed conditions of the coolant and/or based on one or more other parameters including, but not limited to, energy generation, battery capacity, energy demands of other electrical components of the engine system 10 (e.g., HVAC requests, etc.).

As shown in FIG. 3, the cooling fan 204 may receive electrical energy from at least one of the battery system 32 and the energy recovery system 34 of the power system 30. The controller 300 is structured to control which of the battery system 32 and the energy recovery system 34 provides the electrical energy to the cooling fan 204. The controller 300 make these determinations and in what quantities based on various operating parameters of the engine system 10 and the components of the engine system 10 (e.g., the energy recovery system 34, the accumulator system 100, the heat management system 200, etc.).

Figure 4:
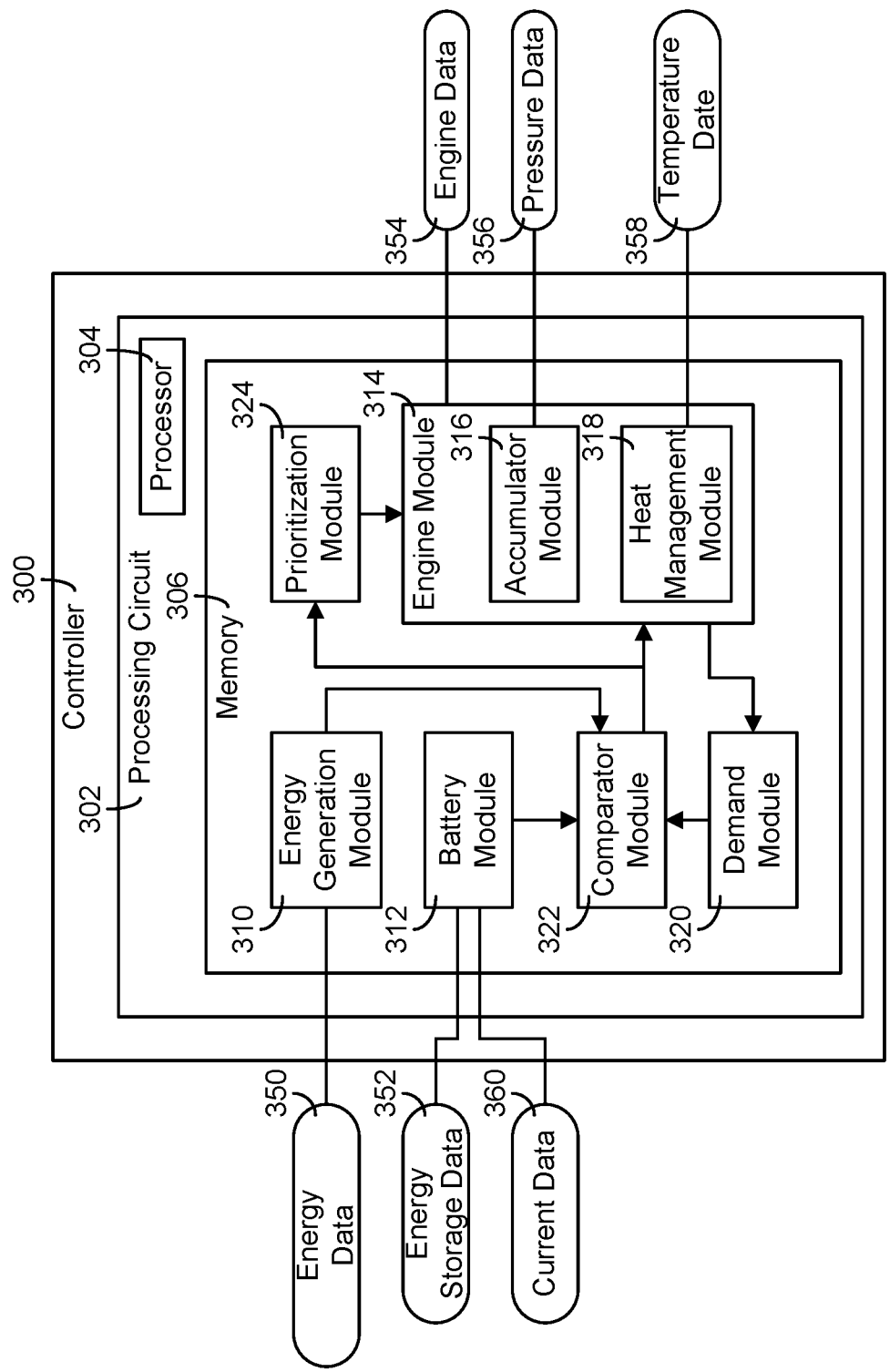
FIG. 4 is a schematic diagram of the controller for the engine system of FIG. 1, according to an example embodiment.

Referring now to FIG. 4, the function and structure of the controller 300 are shown according to one embodiment. The controller 300 is shown to include a processing circuit 302 including a processor 304 and a memory 306. The processor 304 may be implemented as a general-purpose processor, an application specific integrated circuit (ASIC), one or more field programmable gate arrays (FPGAs), a digital signal processor (DSP), a group of processing components, or other suitable electronic processing components. The one or more memory devices 306 (e.g., NVRAM, RAM, ROM, Flash Memory, hard disk storage, etc.) may store data and/or computer code for facilitating the various processes described herein. Thus, the one or more memory devices 306 may be communicably connected to the processor 304 and provide computer code or instructions to the processor 304 for executing the processes described in regard to the controller 300 herein. Moreover, the one or more memory devices 306 may be or include tangible, non-transient volatile memory or non-volatile memory. Accordingly, the one or more memory devices 306 may include database components, object code components, script components, or any other type of information structure for supporting the various activities and information structures described herein.

The memory 306 is shown to include various modules for completing the activities described herein. More particularly, the memory 306 includes an energy generation module 310, a battery module 312, an engine module 314, an accumulator module 316, a heat management module 318, a demand module 320, a comparator module 322, and a prioritization module 324. The modules 310-324 are structured to control the energy supply to various engine subsystems 50 based on the operation of the engine system 10 and the electrical energy available (e.g., the stored energy in the battery system 32, the amount of energy being generated by the energy recovery system 34, etc.). While various modules with particular functionality are shown in FIG. 4, it should be understood that the controller 300 and memory 306 may include any number of modules for completing the functions described herein. For example, the activities of multiple modules may be combined as a single module, as additional modules with additional functionality may be included, etc. Further, it should be understood that the controller 300 may further control other activity beyond the scope of the present disclosure.

Example and non-limiting module implementation elements include sensors providing any value determined herein, sensors providing any value that is a precursor to a value determined herein, datalink and/or network hardware including communication chips, oscillating crystals, communication links, cables, twisted pair wiring, coaxial wiring, shielded wiring, transmitters, receivers, and/or transceivers, logic circuits, hard-wired logic circuits, reconfigurable logic circuits in a particular non-transient state configured according to the module specification, any actuator including at least an electrical, hydraulic, or pneumatic actuator, a solenoid, an op-amp, analog control elements (springs, filters, integrators, adders, dividers, gain elements), and/or digital control elements.

Certain operations of the controller 300 described herein include operations to interpret and/or to determine one or more parameters. Interpreting or determining, as utilized herein, includes receiving values by any method known in the art, including at least receiving values from a datalink or network communication, receiving an electronic signal (e.g. a voltage, frequency, current, or PWM signal) indicative of the value, receiving a computer generated parameter indicative of the value, reading the value from a memory location on a non-transient computer readable storage medium, receiving the value as a run-time parameter by any means known in the art, and/or by receiving a value by which the interpreted parameter can be calculated, and/or by referencing a default value that is interpreted to be the parameter value.

The energy generation module 310 is structured to determine energy generation events and quantities of energy generated during such events by components such as the braking system 40 and the energy recovery system 34. The energy generation module 310 may be communicably coupled to one or more sensors, such as the sensors 340, configured to acquire, gather, and/or receive energy data 350. As such, the energy generation module 310 may include communication circuitry (e.g., relays, wiring, network interfaces, circuits, etc.) that facilitate the exchange of information, data, values, non-transient signals, etc. between and among the energy generation module 310 and the one or more sensors 340. The energy data 350 may provide an indication of the type of energy available: free energy or non-free energy. The energy data 350 may include an indication of an accelerator pedal position, a vehicle speed, a brake pedal position, an engine fueling rate, an amount of electrical energy generated, and any other data point that provides an indication of the type of energy available. In some embodiments, the energy generation module 310 may include or be communicably coupled to the energy recovery system 34 as a means for controlling operation of the energy recovery system 34. As such, the energy generation module 310 may be structured to control where the energy generated by the energy recovery system 34 is directed. For example, the energy generation module 310 may cause the energy recovery system 34 to provide the generated energy to the battery system 32, one or more of the engine subsystems 50, or a combination thereof.

The battery module 312 is structured to determine the available energy storage capacity of the battery system 32. The battery module 312 may be communicably coupled to one or more sensors, such as the sensors 340, configured to acquire energy storage data 352 and/or current data 360. As such, the battery module 312 may include communication circuitry (e.g., relays, wiring, network interfaces, circuits, etc.) that facilitate the exchange of information, data, values, non-transient signals, etc. between and among the battery module 312 and the one or more sensors 340. The energy storage data 350 may provide an indication of the amount of energy stored within the battery system 32. In some embodiments, the battery module 312 may include or be communicably coupled to the battery system 32 as a means for controlling operation of the battery system 32. As such, the battery module 312 may be structured to control the timing of and the amount of the stored energy within the battery system 32 that is supplied to one or more of the engine subsystems 50. The current data 360 may provide an indication of a current output of the power system 30 (e.g., the battery system 32, etc.). The battery module 312 may be structured to monitor the current output of the battery system 32. Typically, the supply limitation that causes output voltage of electrical power system to falter and drop is a current limit of the electrical power system. For this reason, the battery module 312 is structured to monitor the output current of the battery system 32.

The engine module 314 is structured to receive engine data 354 indicative at least one operating characteristic of the engine 20. The engine module 314 may be communicably coupled to one or more sensors, such as the sensors 340, configured to acquire the engine data 350. As such, the engine module 314 may include communication circuitry (e.g., relays, wiring, network interfaces, circuits, etc.) that facilitate the exchange of information, data, values, non-transient signals, etc. between and among the engine module 314 and the one or more sensors 340. The at least one engine characteristic may include an engine speed, an engine temperature, a throttle position, an amount of fueling, a power output, and/or any other engine characteristics that indicate a current demand required to be met by the engine 20. In some embodiments, the engine module 314 may include or be communicably coupled to the engine 20 as a means for controlling operation of the engine 20.

The accumulator module 316 is structured to receive pressure data 356 indicative of a pressure in the accumulator tank 140. The accumulator module 316 may be communicably coupled to one or more sensors, such as the pressure sensors 342, configured to acquire the pressure data 356. As such, the accumulator module 316 may include communication circuitry (e.g., relays, wiring, network interfaces, circuits, etc.) that facilitate the exchange of information, data, values, non-transient signals, etc. between and among the engine module 314 and the one or more pressure sensors 342. The pressure data 356 may be received continuously, periodically, and/or based on operation of one or more components (e.g., the compressor 110, etc.).

In some embodiments, the accumulator module 316 may include or be communicably coupled to the accumulator system 100 as a means for controlling operation of the motor 120 to operator the compressor 110. In regard to the pressure data 356, the pressure data 356 may indicate that the pressure in the accumulator tank 140 is at or below a minimum pressure setting, at or above a maximum allowed pressure, or somewhere in between. When the pressure in the accumulator tank 140 is at or below a minimum pressure setting, the accumulator module 316 may activate the charging or facilitate the activation of a charging source, such as the compressor 110, for the accumulator tank 140. This is because one or more components in the engine system 10 may need at least the minimum pressure in the accumulator tank 140 to function. When the pressure is at or above the maximum allowed pressure, the accumulator module 316 deactivates the compressor 110 to prevent over-pressurizing the accumulator tank(s) 140. When pressure in the accumulator tank 140 is somewhere in between the minimum and maximum pressure or less than the minimum pressure setting, the energy data 350, the energy storage data 352, the pressure data 356, and the accumulator tank pressure setting may influence the charging of the accumulator tank(s) 140.

The heat management module 318 is structured to receive temperature data 358 indicative of a temperature of at least one of the radiator 202, the engine 20, and the coolant. The heat management module 318 may be communicably coupled to one or more sensors, such as the temperature sensor 344, configured to acquire the temperature data 358. As such, the heat management module 318 may include communication circuitry (e.g., relays, wiring, network interfaces, circuits, etc.) that facilitate the exchange of information, data, values, non-transient signals, etc. between and among the heat management module 318 and the one or more temperature sensors 344. The temperature data 358 may be received continuously, periodically, and/or based on operation of one or more components (e.g., the cooling fan 204, etc.). In some embodiments, the heat management module 318 may include or be communicably coupled to the heat management system 200 as a means for controlling operation of the cooling fan 204 to modulate the target temperature of the coolant in the radiator 202.

The demand module 320 is configured to determine the energy demands of the various engine subsystems 50 based on the operation of the engine system 10. As such, the demand module 320 may include communication circuitry (e.g., relays, wiring, network interfaces, circuits, etc.) that facilitate the exchange of information, data, values, non-transient signals, etc. between and among the demand module 320, the engine module 314, the accumulator module 316, and the heat management module 318. For example, the demand module 320 may determine that the accumulator system 100 requires a supply of energy to run the compressor 110 to increase the pressure within the accumulator tank above the minimum pressure setting. In another example, the demand module 320 may determine that the heat management system 200 requires a supply of energy to run the cooling fan 204 to decrease the temperature of the coolant, and consequently the engine 20.

The comparator module 322 is structured to compare the various data and determinations made by the other modules 310-320 to make determinations on energy supplied to the engine subsystems 50 (e.g., an amount of energy supplied by the battery system 32, an amount of energy stored in the battery system 32 from the energy recovery system 34 and an amount provided to the engine subsystems from the energy recovery system 34, etc.). As such, the comparator module 322 may include communication circuitry (e.g., relays, wiring, network interfaces, circuits, etc.) that facilitate the exchange of information, data, values, non-transient signals, etc. between and among the comparator module 322, the demand module 320, the energy generation module 310, the battery module 312, the engine module 314, the accumulator module 316, and the heat management module 318. In one embodiment, the comparator module 322 is structured to compare the energy being generated by the energy recovery system 34 to the available energy capacity of the battery system 32. Based on the comparison, the comparator module 322 may determine which of the battery system 32, the energy recovery system 34, or a combination thereof should supply energy to the engine subsystems 50. In some embodiments, the comparator module 322 further factors in the existing demands of the engine subsystems 50 to determine how much energy should be provided to each of the engine subsystems 50. In some embodiments, the comparator module 322 is structured to determine whether one or more of the engine subsystems 50 should be supplied decreased amounts of energy or turned off completely in response to the measured current (e.g., indicated by the current data 360, etc.) of the battery system 32 approaching a prescribed limit (i.e., a current threshold).

Figure 5:
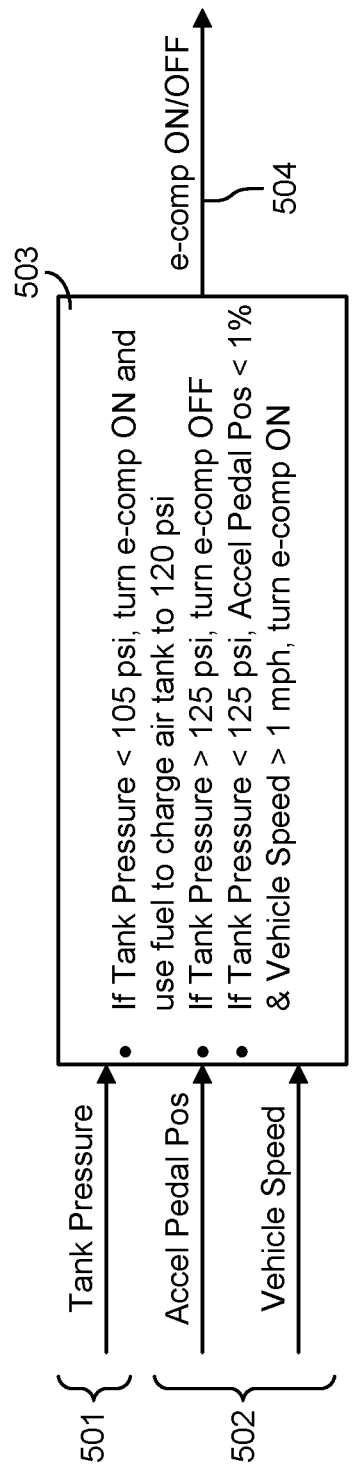
FIG. 5 is a schematic diagram of control logic for the accumulator system of FIG. 2, according to an example embodiment.

The accumulator module 316 and the heat management module 318 may control the accumulator system 100 and the heat management system 200 according to the determinations made by the comparator module 322. Referring also to FIG. 5, example control logic for an implementation of the accumulator module 316 and the comparator module 322 with the accumulator system 100 is shown according to an example embodiment. More particularly, FIG. 5 illustrates the control of a pressure in the accumulator tank 140 using the accumulator module 316 and the comparator module 322. The example control logic is intended for use in a vehicle. More particularly, the example control logic is intended for use in a vehicle with air brakes (e.g., a semi-tractor truck). The example control logic may be embodied in the accumulator module 316 and/or the comparator module 322.

Accordingly, the comparator module 322 receives the pressure data 356 (input 501) and the energy data 350 (input 502). Input 502 may include, for example, the position of the acceleration pedal of the vehicle and the current vehicle speed. As described above, from the energy data 350, the comparator module 322 determines the availability of free energy at block 503. In this example, the adjustable pressure setting is 120 PSI, the minimum pressure setting is 105 PSI, and the maximum allowed pressure in the tank is 125 PSI. If the tank pressure is below 105 PSI, the accumulator module 316 provides a command (output 504) to turn on the electric compressor 110 by using fuel (non-free energy) to charge the tank to 120 PSI. When the tank pressure reaches 125 PSI, the accumulator module 316 provides a command to deactivate the electric compressor (output 504).

According to this example, the controller 300 uses the following preset standards to determine the availability of free energy based on the pressure data. If the tank pressure is less than 125 PSI, the accelerator pedal position is less than one-percent, and the vehicle speed is greater than one mile-per-hour, the controller 300 provides a command (output 404) to activate the electric compressor to charge the air tank. This command may be provided until the maximum allowed pressure in the tank is reached or the availability of free energy ceases. With the above example conditions, the accelerator pedal is barely depressed (if at all), but the vehicle is moving. Because the accelerator pedal is barely depressed, engine fueling is minimized. Thus, application of the regenerative braking system may be in use (accelerator pedal is not being used), such that free energy is available. Accordingly, the controller 300 provides a command to activate the electric compressor.

Figure 6:
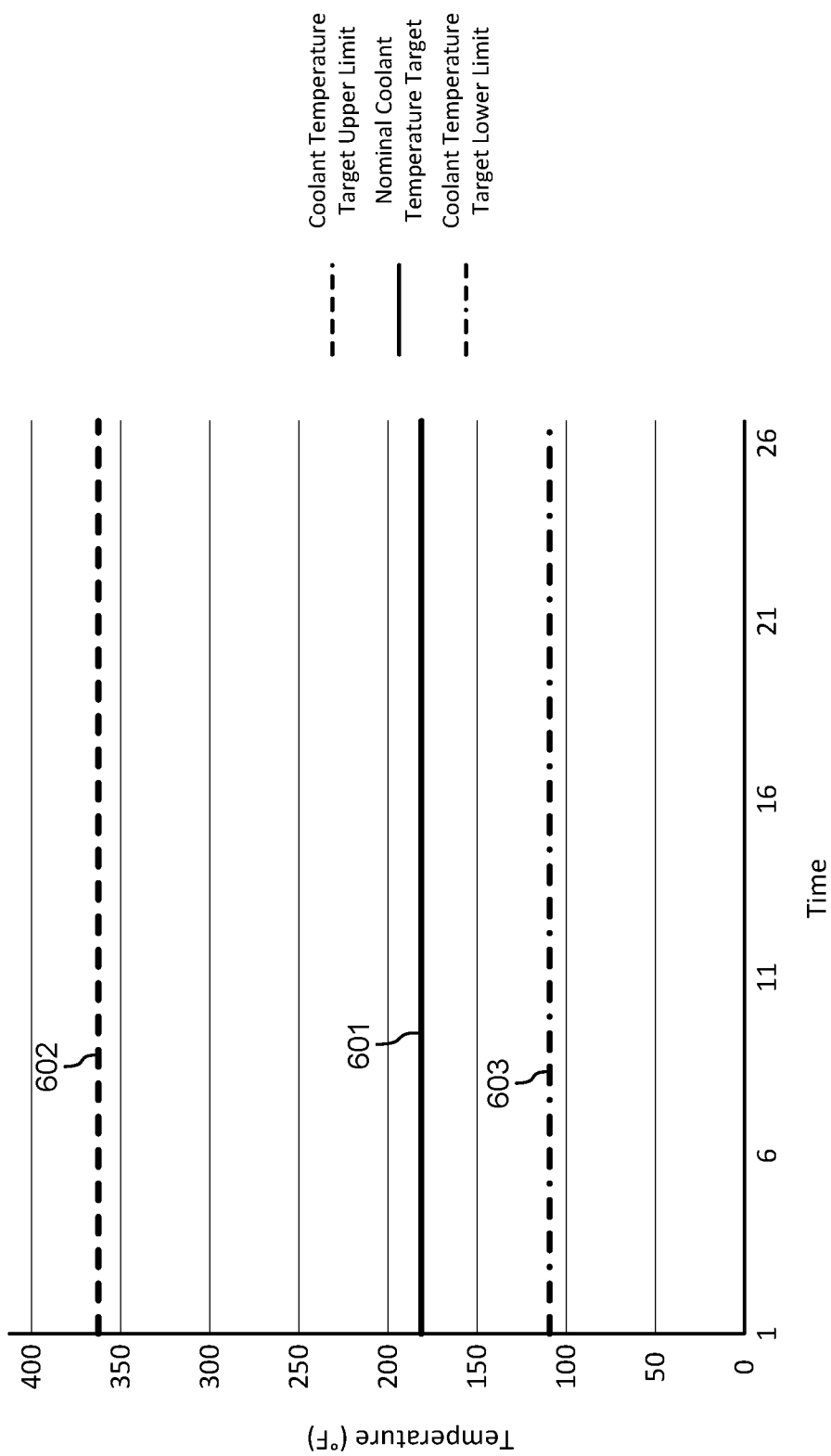
FIG. 6 is a graph of coolant regimes used for controlling the temperature of a coolant using a heat management system, according to an example embodiment.

Referring now to FIG. 6, a graph of coolant regimes used for energy management systems in accordance with example embodiments is shown. More particularly, FIG. 6 illustrates the control of the temperature of a coolant using the heat management module 318 and the comparator module 322. During periods of time when extra energy would be required to run the cooling fan 204 because the coolant temperature is above a nominal coolant temperature target 601, the nominal coolant temperature target 601 is increased toward an upper limit threshold 602. This upper limit threshold 602 could be as high as 260 degree F. for some embodiments. If the coolant temperature reaches the upper limit threshold 602, the cooling fan 204 engages. If the coolant temperature, for example as sensed by the temperature sensor 344, does not reach the upper limit threshold 602, then the cooling fan 204 comes on at the next regenerative braking opportunity. During periods of time when the coolant temperature is at the nominal coolant temperature target 601, but braking energy from a regenerative braking event is available that is not storable in the battery system 32 (for insufficient capacity in the battery system 32), the nominal coolant temperature target 601 is decreased towards a coolant temperature lower limit 603. Decreasing the nominal coolant temperature target 601 towards the coolant temperature lower limit 603 causes the cooling fan 204 to run and thereby drop the coolant temperature below the nominal coolant temperature target 601 to allow for decreased fan requirements for cooling during other operating times.

Referring again to FIG. 4, the prioritization module 324 is structured to determine which of the engine subsystems 50 should receive energy based on load criticality and storage capability of the various engine subsystems 50 and the battery system 32. As such, the prioritization module 324 may include communication circuitry (e.g., relays, wiring, network interfaces, circuits, etc.) that facilitate the exchange of information, data, values, non-transient signals, etc. between and among the prioritization module 324, the comparator module 322, the engine module 314, the accumulator module 316, and the heat management module 318. It would be desirable to have a backup or second-tiered approach for powering various vehicle subsystems if the battery management system as described in the present disclosure fails to detect an overloaded supply for any reason. For example, some vehicle subsystems that require loads are subject to operator selection and cannot be turned on an off by the controller 300 (e.g., HVAC fans, headlights, window defoggers, cigarette lighters, etc.). The prioritization module 324 may be configured to manage a backup power system to account for such vehicle subsystems, to avoid a brown-out condition.

The prioritization module 324 is structured to determine a prioritization structure for the engine subsystems 50. The reduction of an accessory load does not need to be done uniformly, as there are load characteristics that may suggest a "natural" prioritization structure, allowing some accessory loads to be maintained while other accessory loads are reduced. The first priority may be the criticality of the load. For example, the engine subsystems 50 that are critical to proper vehicle operation (e.g., a power steering system, etc.) should not be compromised and therefore are not good candidates to be manipulated as part of the load management. A second priority may be the means of energy storage associated with the load. Many accessory loads on an engine or vehicle perform a function that represents some form of energy translation, which have a degree of energy storage capability. Energy storage capability provides the means to offset reduced operation with increased operation at some point in the future. For example, an air compressor for vehicle pneumatics converts mechanical energy into pneumatic energy usually stored in an air tank (e.g., the accumulator system 100, etc.); reduced compressor operation now can be offset by harder operation in the future, relying on the stored compressed air to bridge the temporary gap. Similarly, engine or motor cooling system regulates the thermal energy stored in the system; reduced cooling operation now can be offset by harder operation in the future so long as the system can tolerate the temporary increase in thermal energy (e.g., the heat management system 200, etc.). As another example, power steering has no storage capability, so is not a good candidate for accessory load adjustment. The prioritization module 324 uses the priorities to determine which accessory loads should be adjusted if an electrical overloading situation arises.

The prioritization module 324 is structured to prioritize and/or categorize the loads based on their individual properties. The prioritization structure determined by the prioritization module 324 may be used to adjust down individual loads in an analog fashion substantially only if the total load exceeds what is able to be provided by the battery system 32 and/or the energy recovery system 34. The loads may be adjusted in order of increasing priority determined by the prioritization module 324, and may only be adjusted until the total load drops below the available power supply (e.g., the stored energy in the battery system 32 and the generated energy by the energy recovery system 34, etc.). Loads may not necessarily be shut off completely, unless shutting off is a normal operating mode of that device and is appropriate for current operating conditions. Conversely, loads may also be adjusted upward if an energy generation event (e.g., a vehicle braking event, etc.) indicates free energy is available. Each load has its own priority (all may be different) and a range of allowed adjustability determined by the prioritization module 324. In one embodiment, the prioritization module 324 may communicate with the controllers for the individual primary loads (e.g. hydraulic pumps, radiator fan, pneumatic compressor, air conditioning compressor, the accumulator system 100, the heat management system 200, etc.). The total loading is tallied and compared to the available power supply by the comparator module 322. In the event of an indicated overload, individual engine subsystems 50 can be derated, with the derates occurring in order of increasing priority determined by the prioritization module 324 until the overload is eliminated. This may provide a robust and individualistic control approach with the loads to facilitate better management and operating characteristics of the engine system 10, specifically efficiently of the engine 20, the power system 30, and/or the engine subsystems 50.

Figure 7:
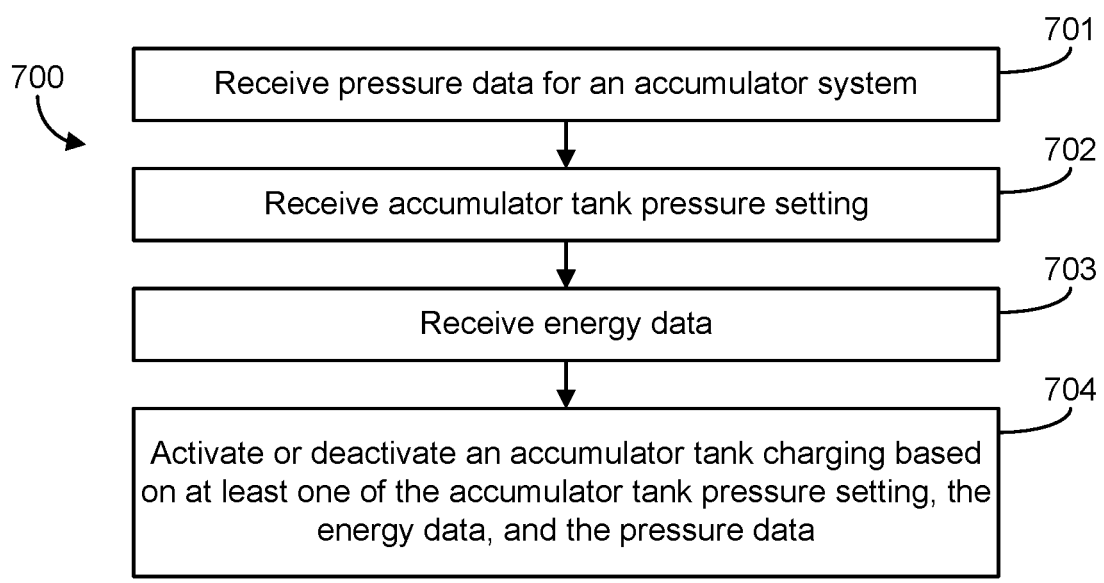
FIG. 7 is a flow diagram of a method of minimizing energy consumption in an accumulator system, according to an example embodiment.

Referring now to FIG. 7, a method 700 of minimizing energy consumption in an accumulator system 100 is shown according to an example embodiment. Method 700 may be implemented with the controller 300 of FIG. 1 and the accumulator system 100 of FIG. 2. Accordingly, method 700 is described with regards to FIGS. 1-2. At the outset, the accumulator tank(s) 140 of the accumulator system 100 may have preset cut-in and cut-out pressures. However, the cut-in and cut-out pressures may be adjusted by a user of the system via the controller 300. In either configuration, method 700 begins at block 701. At block 701, the controller 300 receives pressure data for an accumulator system (e.g., the accumulator system 100, etc.). The pressure data may be obtained by a pressure sensor (e.g., the pressure sensor 342, etc.) and correspond with a pressure level in each one of the one or more accumulator tanks (e.g., the accumulator tank 140, etc.). The pressure data may be received continuously, periodically, and/or based on operation of one or more components (e.g., the compressor 110, etc.).

As mentioned above in regard to FIG. 1, in some embodiments, the controller 300 may receive a pressure setting for the accumulator tank (block 702). The pressure setting controls the amount of non-free energy used to charge (fill) the accumulator tank(s). In one embodiment, the pressure setting is less than a cut-out setting (i.e., maximum allowed pressure) for the accumulator tank.

At block 703, the controller 300 receives energy data. The energy data provides an indication of the type of energy available: free energy or non-free energy. As described in regard to block 704, knowing the type of energy available enables the controller 300 to control activation of the compressor (e.g., via the motor 120, etc.) to minimize energy consumption. The energy data may include an indication of an accelerator pedal position, a vehicle speed, a brake pedal position, an engine fueling rate, and any other data point that provides an indication of the type of energy available. Sensors may be communicably coupled to the controller 300 and any other component within the vehicle (e.g., power system 30, etc.). Accordingly, the sensors may provide the controller 300 with the energy data by monitoring/taking measurements from one or more components in the vehicle or engine system.

As an example, a position sensor may be mounted on the brake pedal in a vehicle and the power system may be configured as a regenerative braking system (e.g., the braking system 40, etc.). The position sensor provides data to the controller 300 regarding the position of the brake pedal. Accordingly, the controller 300 may determine when the brake pedal is depressed. In this example, when the brake pedal is depressed, regenerative braking is occurring. As such, the controller 300 determines that free energy is available. As soon as the sensor provides data that the brake pedal is no longer depressed, the controller 300 may determine that free energy is no longer available. This information is used to provide the command described in block 704. Although described in regard to the brake pedal position, the same type of sensor reading may be provided in regard to the accelerator pedal position. Similarly, a rapid decrease in vehicle speed may indicate the occurrence of braking and, therefore, that free energy is available. While only a few data points are shown as representatives of when free energy available, a wide variety of other data points may also be sampled to provide an indication.

After block 703, the controller 300 provides a command to activate or deactivate the charging of the accumulator tank (block 704) based on at least one of the pressure data, the accumulator tank pressure setting, and the energy data. In regard to the pressure data, the pressure data may indicate that the pressure in the accumulator tank is at or below the minimum pressure setting, at or above the maximum allowed pressure, or somewhere in between. When the pressure in the tank is at or below a minimum pressure setting, the controller 300 may activate the charging of the tank. This is because one or more components in the vehicle may need at least the minimum pressure in the tank to function. When the pressure is at or above the maximum allowed pressure, the controller 300 deactivates the compressor to prevent over-pressurizing the tank(s). When pressure in the tank is somewhere in between the minimum and maximum pressure or less than the minimum pressure setting, the energy data and accumulator tank pressure setting may influence the charging of the tank(s).

In one example configuration, the pressure in the accumulator tank is somewhere in between the minimum and maximum pressure. When the controller 300 determines that free energy is available based on the energy data, the controller provides a command to activate the charging of the accumulator tank. The controller 300 provides this command until either the maximum allowed pressure in the tank (e.g., from pressure sensor 342, etc.) is reached or no more free energy is available, whichever occurs first. If the pressure in the tank is at the maximum allowed pressure but free energy is available, the controller 300 may provide a command to store this energy in one or more batteries for later use (e.g., when the pressure in the tank drops below a minimum pressure setting).

In another example configuration, the pressure in the accumulator tank is below the minimum pressure setting (i.e., the cut-in pressure). As described above, the minimum pressure setting is the minimum amount of pressure needed in the tanks to run one or more components in the vehicle powered by the tanks (e.g., the air brakes). Therefore, for safety, the controller 300 may be preset to activate the charging of the tank(s) when the pressure is at or below the minimum pressure setting, regardless of the availability of free energy. Rather than commanding the tanks to be charged to the maximum allowed pressure, the controller 300 may command the tank(s) to be charged to the adjustable pressure setting (block 702) utilizing any stored or determined available amount of free energy. Thus, in one embodiment, the adjustable tank pressure setting may be less than the maximum allowed pressure. However, the adjustable tank pressure setting may function akin to the maximum allowed pressure. When the adjustable tank pressure setting pressure is reached in the tank, the charging of the tank is deactivated by the controller 300. If there is no stored or available free energy, non-free energy may be used to power the compressor to charge the tank to the adjustable tank pressure setting. In any event, because the adjustable tank pressure setting is less than a maximum allowed pressure setting, the energy (free or non-free) needed to charge the tank(s) is relatively smaller. If at any time free energy becomes available, the controller 300 may provide a command to utilize the free energy in place of the non-free energy. The command may be sustained until the free energy is no longer available or the maximum allowed pressure in the tank(s) is reached (whichever occurs first). If the pressure setting (block 702) is not reached during the use of free energy, the controller 300 may provide a command to continue to charge the tank until the pressure setting is reached (thus, for that example, the energy usage is: non-free—free—non-free up to the pressure setting).

As such, in summary of the example embodiments, the controller 300 may provide a command to charge the tank based on the pressure data, energy data, and the accumulator tank pressure setting. Whenever free energy is available, the controller 300 may command charging until the availability of free energy ceases or the maximum allowed pressure is reached, whichever occurs first. In order to conserve energy, when free energy is not available and the pressure is below a minimum pressure setting, the controller 300 may command a charging of the tank to the accumulator tank pressure setting (block 702), which is below the maximum allowed pressure of the tank. When the accumulator tank pressure setting is reached and free energy is not available to fully charge the tank, the controller 300 may provide a command to deactivate the compressor to reduce energy consumption (i.e., from continual operation). Similarly, when the maximum allowed pressure is reached, the controller 300 may also provide a command to deactivate the compressor. Also, when the pressure data indicates the pressure to be in between the minimum and maximum pressure, the controller 300 may keep the compressor off until the energy data indicates the availability of free energy and/or the pressure in the tank drops to at or below the minimum pressure setting.

Minimum pressure setting, maximum pressure setting, and the adjustable tank pressure setting may be completely customizable by a user via the controller 300 depending on the application. Similarly, use of the tank pressure setting may be activated or deactivated via the controller 300 depending on the application. Accordingly, a wide variety of customization may be possible with method 700 in conjunction with the controller 300.

As an example, method 700 may be implemented with an electric heating ventilation and air conditioning (HVAC) system of a vehicle. The cabin of the vehicle (i.e., the passenger and operator section of the vehicle) includes temperature control gauges that allow for control of the cabin temperature. Typically, a temperature sensor (e.g., thermostat) is also implemented to gauge the temperature relative to a desired temperature. Utilizing method 700 and controller 300, the cabin temperature is adjusted based on the availability of free energy. For example, an operator of the vehicle may turn the cabin heat on to a desired heating temperature. For a vehicle with a heater core (e.g., a radiator placed external to the cabin in the engine compartment near the firewall, typically near the passenger compartment), engine coolant flows through the engine (becoming heated) and then to the heater core when the heat is turned on. When the heater is not turned on, the coolant cycles directly back around through a radiator of the vehicle and then through the engine again. When the heat is turned on, a blower (e.g., a fan) is also activated that blows the heated coolant that is flowing through the heater core. The heated coolant heats the air which is pushed through the ventilation in a vehicle to increase the cabin temperature. To control the direction of the coolant and provide motive force (e.g., propel the coolant around the system), one or more valves and a pump are typically utilized.

Applying method 700 to the example above, a coolant tank or reservoir would be analogous to the accumulator tank 140 of FIG. 2. The controller of a vehicle, such as controller 300, receives pressure data for coolant tank (block 701). The pressure data indicates a capacity level for the tank (e.g., a level of fullness). The controller also receives energy data (block 702), which provides an indication of the availability of free energy. When free energy is available, the controller provides a command to heat the cabin (block 704). The command may include activating the blower and opening one or more valves to direct the heated coolant (from the engine) to the heater core. In this situation, relative to the heating temperature desired, the controller may command that heat be provided until a set temperature above the heating temperature is achieved (e.g., ten degrees). Over time, the cabin temperature may decrease such that an average temperature of the cabin may be closer to the heating temperature than if the heater was deactivated upon reaching the heating temperature. This method also takes advantage of the available free energy to continue to provide heat to the cabin and to activate the heating system when free energy is available.

In a similar application, the method 700 may be utilized with the cooling portion of the HVAC system as well. In this case, a compressor (e.g., the electric compressor of FIG. 2 that collectively refers to the motor 120 and the compressor 110) compresses and pumps refrigerant around the cooling system (e.g., the condenser, evaporator, drier/receiver, etc.).

The accumulator tank for the refrigerant may be a separate holding vessel or may be combined with a drier/receiver in the circuit. Here, activation of the cooling system (e.g., a compressor) is controlled based on the availability of free energy. When free energy is available, the controller activates the system. When free energy is not available, the controller deactivates the system. However, the operator may utilize one or more cabin controls to override the deactivation. In this configuration, as in the heating configuration above, heating and cooling is controlled based on the availability of free energy.

Another example implementation of the accumulator system 100 and the method 700 is with a hydraulic system of a vehicle. In some vehicles, hydraulic systems may provide actuation of one or more vehicle devices using hydraulic fluid. These vehicle devices may include, but are not limited, hydraulic brakes, power steering, crane/boom operation, etc. In this case, the accumulator tank may be structured as a hydraulic accumulator because of the use of hydraulic fluid. As compared to a compressor with the system in FIG. 2, the controller may activate/deactivate a mechanical or electric hydraulic pump to charge the hydraulic accumulator when free energy is available. In doing so, the controller avoids turning the pump on in the future (when free energy is not available) by using the stored hydraulic pressure caused by the free energy activation of the pump.

Figure 8:
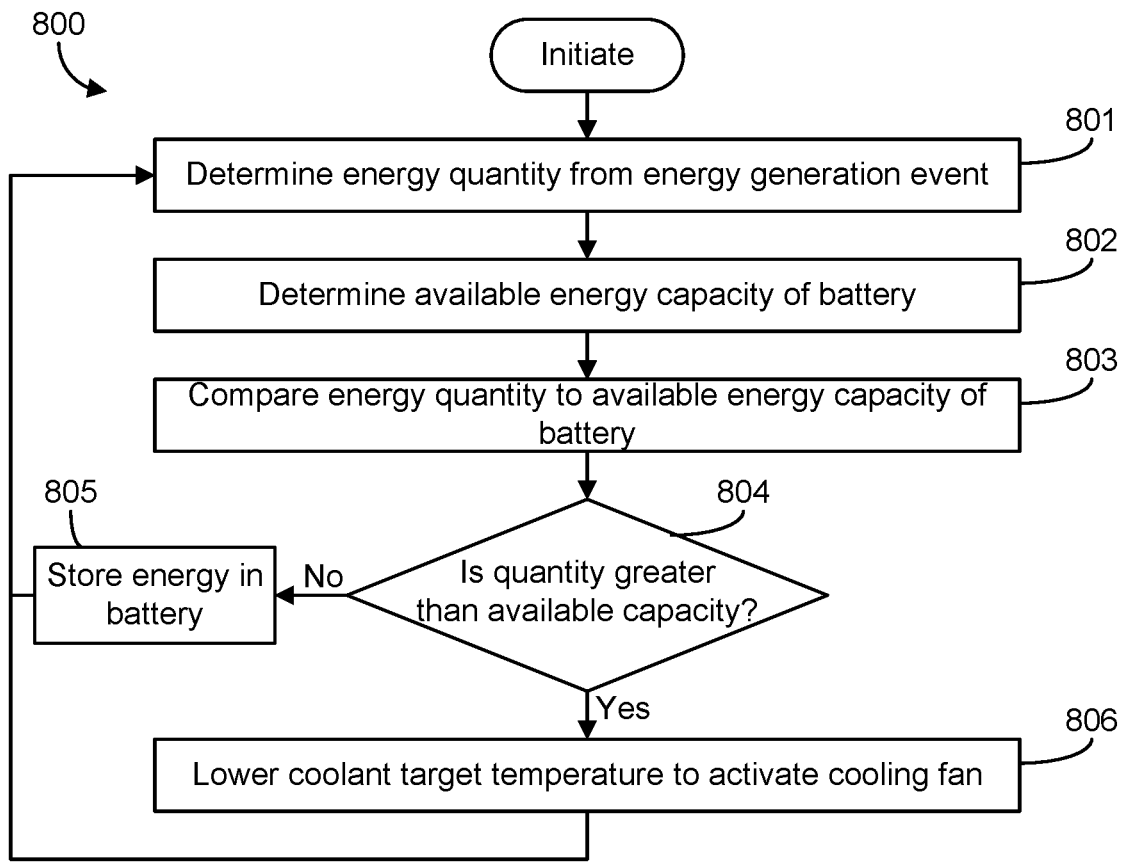
FIG. 8 is a flow diagram of a method of energy management, according to an example embodiment.

Referring to FIG. 8, a method 800 of energy management is shown according to an example embodiment. The method 800 may be executed by, for example, the controller 300 and the modules thereof. At block 801, the controller 300, and more particularly the energy generation module 310, determines a quantity of available energy generated from an energy generation event. For example, at block 801, energy generation module 310 may determine an event from the braking system 40 (e.g., regenerative braking) or energy conservation (e.g., energy not being used during coasting of a vehicle or during a vehicle idle condition). Block 801 may include receiving data from one or more sensors 340 coupled to various vehicle systems for determining the event, and may include the identification of if the energy is free or non-free.

At block 802, the controller 300, and more the particularly battery module 312, determines the available capacity of a vehicle battery system to determine if the energy generated during the energy generation event may be stored via the battery. In some embodiments, there may be more energy generated from an event (e.g., a braking event may generate more energy than can be stored by the battery).

At block 803, the controller 300, and more particularly the comparator module 322, compares the quantity of energy generated during the energy generation event to the capacity currently available at the battery. At block 804, the controller 300 analyzes how to store the generated energy based on the outcome of the comparison at 803. Specifically, if the quantity of energy generated via the energy generation event is less than or equal to the quantity of available capacity in the battery system, the energy generated during the energy generation event is stored in the battery (represented at block 805). However, if the quantity of energy generated via the energy generation event is greater than the quantity of available capacity in the battery system, it is beneficial during this time to store energy generated during the energy generation event.

As one example, the energy may be used in the coolant system in the form of excess cooling. During a braking event in which the batteries do not need to be charged, the fan may be operated to lower the coolant temperature. The operation of the fan is controlled through lowering the target coolant temperature of coolant contained in a heat management system, such as a radiator system configured to cool the internal combustion engine of the vehicle. Accordingly, at block 806, the energy management system causes the target coolant temperature for the coolant contained in the radiator system to be lowered to control actuation of the cooling fan for the heat management system. The lowered target temperature causes the fan to come on sooner than it would at the nominal coolant target temperature, thereby cooling the coolant in the heat management system to a temperature lower than the normal. As discussed in the present disclosure, the target temperature may be permitted to rise in example embodiments to conserve energy. For example, referring again to FIG. 6, the temperature may be permitted to fall from a temperature target 601 closer to the lower limit 603 during the activities of block 806. During subsequent operation of the coolant system, the temperature may be allowed to rise back towards temperature target 601 to conserve energy.

In various other embodiments, the energy may be used or stored in other ways and in other vehicle subsystems. While the embodiment of FIG. 8 shows the coolant temperature and coolant system as an example vehicle subsystem, the method 800 may be applicable for any other vehicle subsystem in which energy may be applied to when there is no capacity in the battery system.

In certain embodiments, the controller 300 includes an HVAC module configured to control engagement of a compressor and/or one or more components of an HVAC system in response to an energy generation event. For example, as an alternative to or in addition to lowering coolant target temperature to activate a cooling fan, the controller 300 may activate a compressor to lower a target temperature of the HVAC system during periods of available electrical energy capacity that exceed the energy storage capacity of a battery system.

Figure 9:
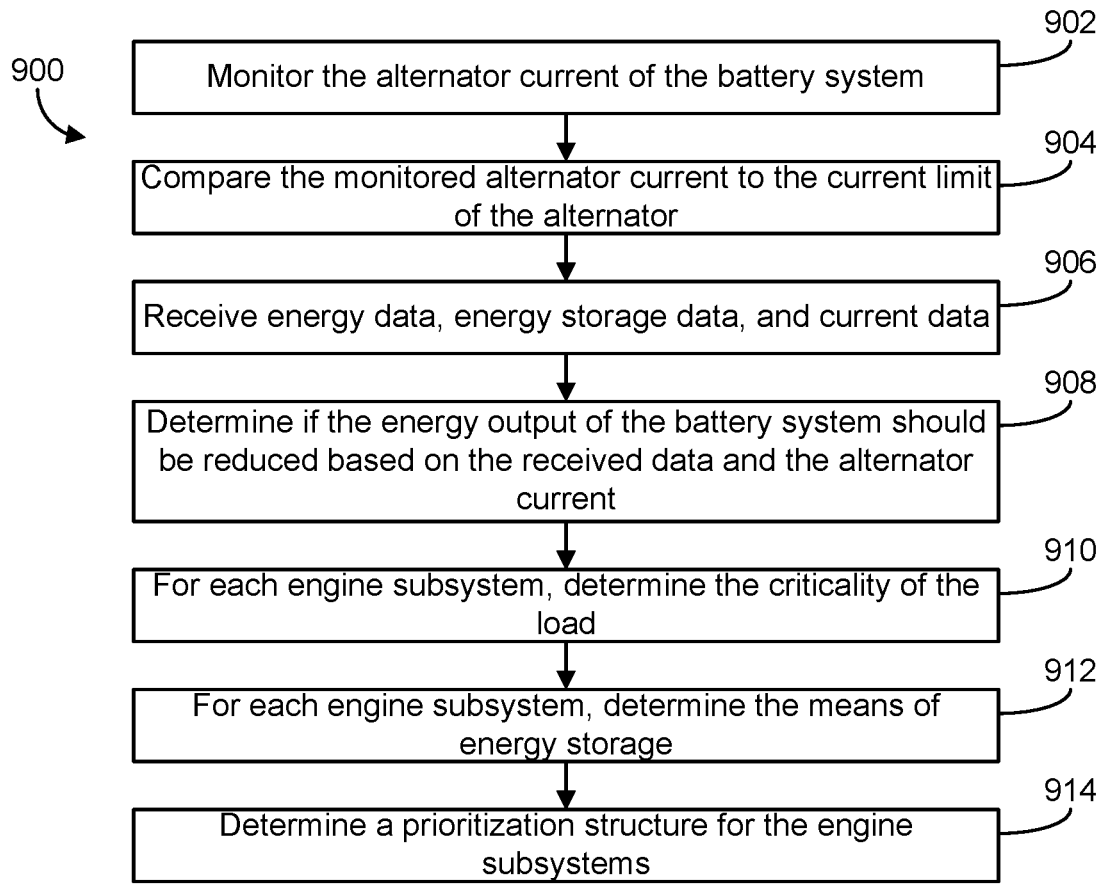
FIG. 9 is a flow diagram of a method, for prioritizing energy distribution among vehicle subsystems, according to an example embodiment.

Referring to FIG. 9, a method 900 for prioritizing energy distribution among vehicle subsystems is shown according to an exemplary embodiment. Process 900 may be executed by, for example, the controller 300 and more particularly the prioritization module 324 of FIG. 4. Process 900 may generally be executed as a backup control strategy, such that a brown-out condition or other critical condition with the power supply of the vehicle is avoided.

Process 900 includes monitoring the alternator current of the battery system 32 (block 902) and comparing the monitored alternator current to the current limit of the alternator (block 904). Blocks 902, 904 generally include the monitoring of the battery system 32 as a backup system in case the battery management system of the present disclosure fails to detect an overloaded supply for any reason. For example, if vehicle subsystems that cannot be turned on and off by the controller 300 (e.g., operator-selectable systems such as HVAC fans, headlights, window defoggers, cigarette lighters, etc.) are operated, an overloaded supply may not be detected. Monitoring the alternator current at block 902 allows for an alternative way of monitoring if the supply is overloaded.

Process 900 further includes receiving energy data, energy storage data, and current data (block 906), along with other data. Block 906 includes obtaining data that may be useful in determining the energy generated by various vehicle subsystems, and the energy currently available at the battery, as generally described in the present disclosure. Process 900 further includes determining if the energy output of the battery system 32 should be reduced based on the received data and the alternator current (block 908).

A prioritization structure for engine subsystems may then be determined. If the energy output of the battery system 32 should be reduced, it should not necessarily be done uniformly, as some accessory loads may be maintained while others are reduced. Process 900 may include, for each engine subsystem, determining the criticality of the load (block 910). For example, engine subsystems that are critical for vehicle operation (e.g., a power steering system, etc.) should not be compromised, while engine subsystems that are not related to general vehicle performance are more likely candidates for load reduction. Process 900 may further include determining the means of energy storage associated with each engine subsystem (block 912). Many subsystems may perform a function that represents some form of energy translation, which have a degree of energy storage capability. This energy storage capability may allow for offsetting a reduced operation with an increased operation in the future. Process 900 then includes determining a prioritization structure for the engine subsystems (block 914). The engine subsystems that are of the highest priority may maintain their load levels, while low priority subsystems have their loads reduced (or shut off completely).

The schematic flow chart diagrams and method schematic diagrams described above are generally set forth as logical flow chart diagrams. As such, the depicted order and labeled steps are indicative of representative embodiments. Other steps, orderings and methods may be conceived that are equivalent in function, logic, or effect to one or more steps, or portions thereof, of the methods illustrated in the schematic diagrams.

Additionally, the format and symbols employed are provided to explain the logical steps of the schematic diagrams and are understood not to limit the scope of the methods illustrated by the diagrams. Although various arrow types and line types may be employed in the schematic diagrams, they are understood not to limit the scope of the corresponding methods. Indeed, some arrows or other connectors may be used to indicate only the logical flow of a method. For instance, an arrow may indicate a waiting or monitoring period of unspecified duration between enumerated steps of a depicted method. Additionally, the order in which a particular method occurs may or may not strictly adhere to the order of the corresponding steps shown. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in machine-readable medium for execution by various types of processors. An identified module of executable code may, for instance, comprise one or more physical or logical blocks of computer instructions, which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of computer readable program code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in machine-readable medium (or computer-readable medium), the computer readable program code may be stored and/or propagated on in one or more computer readable medium(s).

The computer readable medium may be a tangible computer readable storage medium storing the computer readable program code. The computer readable storage medium may be, for example, but not limited to, an electronic, magnetic, optical, electromagnetic, infrared, holographic, micromechanical, or semiconductor system, apparatus, or device, or any suitable combination of the foregoing.

More specific examples of the computer readable medium may include but are not limited to a portable computer diskette, a hard disk, a random access memory (RAM), a read-only memory (ROM), an erasable programmable read-only memory (EPROM or Flash memory), a portable compact disc read-only memory (CD-ROM), a digital versatile disc (DVD), an optical storage device, a magnetic storage device, a holographic storage medium, a micromechanical storage device, or any suitable combination of the foregoing. In the context of this document, a computer readable storage medium may be any tangible medium that can contain, and/or store computer readable program code for use by and/or in connection with an instruction execution system, apparatus, or device.

The computer readable medium may also be a computer readable signal medium. A computer readable signal medium may include a propagated data signal with computer readable program code embodied therein, for example, in baseband or as part of a carrier wave. Such a propagated signal may take any of a variety of forms, including, but not limited to, electrical, electro-magnetic, magnetic, optical, or any suitable combination thereof. A computer readable signal medium may be any computer readable medium that is not a computer readable storage medium and that can communicate, propagate, or transport computer readable program code for use by or in connection with an instruction execution system, apparatus, or device. Computer readable program code embodied on a computer readable signal medium may be transmitted using any appropriate medium, including but not limited to wireless, wireline, optical fiber cable, Radio Frequency (RF), or the like, or any suitable combination of the foregoing.

In one embodiment, the computer readable medium may comprise a combination of one or more computer readable storage mediums and one or more computer readable signal mediums. For example, computer readable program code may be both propagated as an electro-magnetic signal through a fiber optic cable for execution by a processor and stored on RAM storage device for execution by the processor.

Computer readable program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The computer readable program code may execute entirely on the user's computer, partly on the user's computer, as a stand-alone computer-readable package, partly on the user's computer and partly on a remote computer or entirely on the remote computer or server.

The program code may also be stored in a computer readable medium that can direct a computer, other programmable data processing apparatus, or other devices to function in a particular manner, such that the instructions stored in the computer readable medium produce an article of manufacture including instructions which implement the function/act specified in the schematic flowchart diagrams and/or schematic block diagrams block or blocks.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Accordingly, the present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

The invention claimed is:

1. A method comprising:
receiving, by a controller, an upper limit temperature threshold for a coolant of a heat management system;
receiving, by the controller, an indication that a coolant temperature is above a target coolant temperature of the coolant of the heat management system and, in response, increasing the target coolant temperature toward the upper limit temperature threshold, wherein the target coolant temperature controls actuation of a cooling fan of the heat management system;
receiving, by the controller, an indication that electrical energy has been generated from an energy generation event;
and
responsive to at least a portion of the electrical energy generated from the energy generation event exceeding an energy capacity of a battery storage system, causing, by the controller, a transmission of at least the portion of the electrical energy to the heat management system, wherein causing the transmission of at least the portion of the electrical energy to the heat management system includes lowering the target coolant temperature.

2. The method of claim 1, further comprising activating, by the controller, the cooling fan when the coolant temperature is at or near the upper limit temperature threshold.

3. The method of claim 2, further comprising receiving, by the controller, an indication the coolant temperature has not become at or near the upper limit temperature threshold and, in response activating, by the controller, the cooling fan upon detection of a subsequent regenerative braking event.

4. The method of claim 1, further comprising receiving, by the controller, an indication that the coolant temperature is at or near the target coolant temperature and at least the portion of the electrical energy is not storable in the battery storage system and, in response, decreasing the target coolant temperature towards a lower limit temperature threshold for the coolant.

5. The method of claim 1, wherein the energy generation event includes a regenerative braking event.

6. The method of claim 1, further comprising responsive to the electrical energy not exceeding the energy capacity of the battery storage system, facilitating storage, by the controller, of the electrical energy in the battery storage system.

7. A non-transitory computer-readable medium having computer-executable instructions encoded therein, the instructions when executed by one or more processors cause the one or more processors to perform operations comprising:
receiving an upper limit temperature threshold for a coolant of a heat management system;
receiving an indication that a coolant temperature is above a target coolant temperature of the coolant of the heat management system and, in response, increasing the target coolant temperature toward the upper limit temperature threshold, wherein the target coolant temperature controls actuation of a cooling fan of the heat management system;
receiving an indication that electrical energy has been generated from an energy generation event;
and
responsive to at least a portion of the electrical energy generated from the energy generation event exceeding an energy capacity of a battery storage system, causing a transmission of at least the portion of the electrical energy to the heat management system, wherein causing the transmission of at least the portion of the electrical energy to the heat management system includes lowering the target coolant temperature.

8. The non-transitory computer-readable medium of claim 7, wherein the instructions when executed by the one or more processors further cause operations comprising activating the cooling fan when the coolant temperature is at or near the upper limit temperature threshold.

9. The non-transitory computer-readable medium of claim 8, wherein the instructions when executed by the one or more processors further cause operations comprising receiving an indication that the coolant temperature has not become at or near the upper limit temperature threshold and, in response, activating the cooling fan upon detection of a subsequent regenerative braking event.

10. The non-transitory computer-readable medium of claim 7, wherein the instructions when executed by the one or more processors further cause operations comprising receiving an indication that the coolant temperature is at or near the target coolant temperature and at least the portion of the electrical energy is not storable in the battery storage system and, in response, decreasing the target coolant temperature towards a lower limit temperature threshold for the coolant.

11. The non-transitory computer-readable medium of claim 7, wherein the energy generation event includes a regenerative braking event.

12. The non-transitory computer-readable medium of claim 7, wherein the instructions when executed by the one or more processors further cause operations comprising, responsive to the electrical energy not exceeding the energy capacity of the battery storage system, facilitating storage of the electrical energy in the battery storage system.

13. A system comprising:
one or more processing circuits comprising one or more memory devices coupled to one or more processors, the one or more memory devices configured to store instructions thereon that, when executed by the one or more processors, cause the one or more processors to:
receive an upper limit temperature threshold for a coolant of a heat management system;
receive an indication that a sensed temperature of the coolant is above a target temperature of the coolant and, in response, increase the target temperature toward the upper limit temperature threshold;
receive an indication that electrical energy has been generated from an energy generation event; and
responsive to at least a portion of the electrical energy generated from the energy generation event exceeding an energy capacity of a battery storage system, cause a transmission of at least the portion of the electrical energy to the heat management system.

14. The system of claim 13, further comprising the heat management system configured to couple to an engine, the heat management system including a fan and the heat management system structured to circulate the coolant, wherein the coolant absorbs heat from the engine, and wherein the fan is actuated based on the target temperature of the coolant and the sensed temperature of the coolant.

15. The system of claim 13, wherein the instructions, when executed by the one or more processors, further cause the one or more processors to activate a fan of the heat management system when the sensed temperature is at or near the upper limit temperature threshold.

16. The system of claim 13, wherein the instructions, when executed by the one or more processors, further cause the one or more processors to receive an indication that the sensed temperature has not become at or near the upper limit temperature threshold and, in response, activate a fan of the heat management system upon detection of a subsequent regenerative braking event.

17. The system of claim 13, wherein the instructions, when executed by the one or more processors, further cause the one or more processors to receive an indication that the sensed temperature is at or near the target temperature and at least the portion of the electrical energy is not storable in the battery storage system and, in response, decrease the target temperature for the coolant.

18. The system of claim 13, wherein the energy generation event includes a regenerative braking event.

19. The system of claim 13, wherein the instructions, when executed by the one or more processors, further cause the one or more processors to, responsive to the electrical energy not exceeding the energy capacity of the battery storage system, facilitate storage of the electrical energy in the battery storage system.

20. The system of claim 13, wherein activation of a fan of the heat management system is based on the target temperature.

* * * * *